US012769052B2

(12) United States Patent
Li

(10) Patent No.: US 12,769,052 B2
(45) Date of Patent: Oct. 20, 2026

(54) PHOTONIC INTEGRATED CIRCUIT PACKAGES INCLUDING SUBSTRATES WITH GLASS CORES

(71) Applicant: Intel Corporation, Santa Clara, CA (US)

(72) Inventor: Xiaoqian Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 70 days.

(21) Appl. No.: 18/058,996

(22) Filed: Nov. 28, 2022

(65) Prior Publication Data

US 2024/0176069 A1 May 30, 2024

(51) Int. Cl.
*G02B 6/12* (2006.01)
*G02B 6/42* (2006.01)
*H10W 90/00* (2026.01)

(52) U.S. Cl.
CPC ....... *G02B 6/12004* (2013.01); *G02B 6/4204* (2013.01); *H10W 90/00* (2026.01); *G02B 2006/12102* (2013.01)

(58) Field of Classification Search
CPC G02B 6/12004; G02B 6/4214; G02B 6/4204; G02B 6/428; H10W 90/00; H01L 25/167
See application file for complete search history.

(56) References Cited

U.S. PATENT DOCUMENTS

2016/0091679 A1 3/2016 Chou et al.
2016/0327241 A1 11/2016 Wheatley et al.
2020/0098736 A1* 3/2020 Liao .................... G02B 6/1225
2021/0041649 A1* 2/2021 Brusberg ................. C03C 3/04
2021/0066269 A1 3/2021 Yang et al.
2022/0003948 A1 1/2022 Zhou et al.
2022/0244465 A1 8/2022 Winzer et al.
2023/0130467 A1* 4/2023 Polomoff ........... G02B 6/12004 385/14
2024/0176068 A1 5/2024 Li

* cited by examiner

*Primary Examiner* — Michael P Mooney
(74) *Attorney, Agent, or Firm* — Akona IP PC

(57) ABSTRACT

Microelectronic assemblies, related devices and methods, are disclosed herein. In some embodiments, a microelectronic assembly may include a substrate having a glass core with a surface and a dielectric material on a portion of the surface of the core, the dielectric material including conductive pathways and an interconnect die; a processor integrated circuit (XPU) and a photonic integrated circuit (PIC), having an active surface facing towards the core, electrically coupled to the interconnect die and to the conductive pathways; a first optical component optically coupled to the active surface of the PIC and to the surface of the core; and a second optical component coupled to the core, wherein the second optical component is optically coupled to the PIC by an optical pathway through the first optical component and the core.

20 Claims, 16 Drawing Sheets

PHOTONIC INTEGRATED CIRCUIT PACKAGES INCLUDING SUBSTRATES WITH GLASS CORES

TECHNICAL FIELD

The present disclosure relates to packaging photonic integrated circuits (PICs). More specifically, it relates to techniques, methods, and apparatus directed to quasi-monolithic die architectures including PICS.

BACKGROUND

Electronic circuits when commonly fabricated on a wafer of semiconductor material, such as silicon, are called integrated circuits (ICs). The wafer with such ICs is typically cut into numerous individual dies. The dies, including a PIC, may be packaged into an IC package containing one or more dies along with other electronic components such as resistors, capacitors, and inductors. The photonic IC package may be integrated onto an electronic system, such as a consumer electronic system.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figures 1A, 1B:
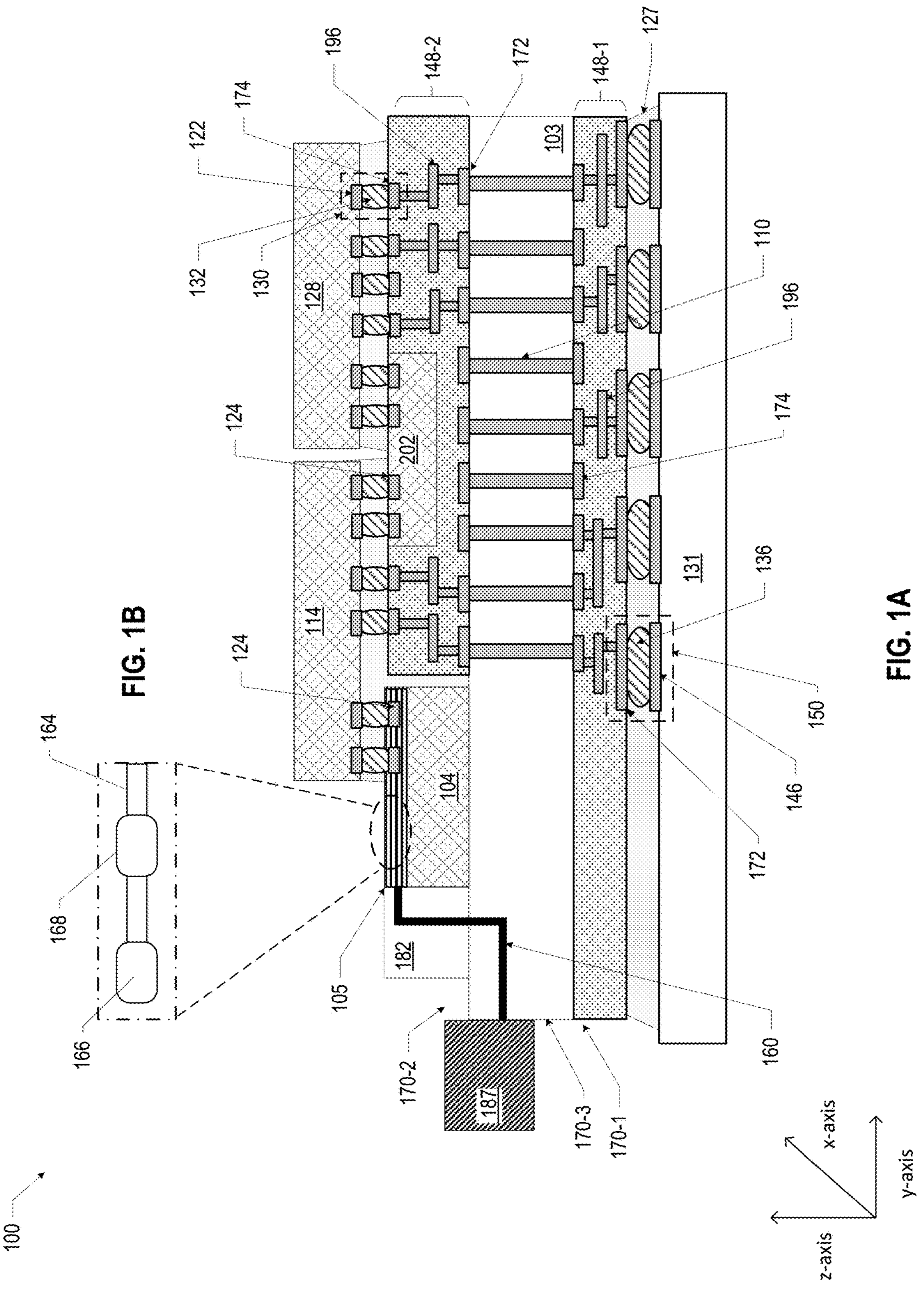
FIG. 1A is a schematic cross-sectional view of an example microelectronic assembly according to some embodiments of the present disclosure.
FIG. 1B is a schematic illustration of an example detail of an active surface of a photonic integrated circuit according to some embodiments of the present disclosure.

For purposes of illustrating photonic IC packages described herein, it is important to understand phenomena that may come into play during assembly and packaging of PICs. The following foundational information may be viewed as a basis from which the present disclosure may be properly explained. Such information is offered for purposes of explanation only and, accordingly, should not be construed in any way to limit the broad scope of the present disclosure and its potential applications.

Advances in semiconductor processing and logic design have permitted an increase in the amount of logic circuits that may be included in processors and other IC devices. As a result, many processors now have multiple cores that are monolithically integrated on a single die. Generally, these types of monolithic ICs are also described as planar since they take the form of a flat surface and are typically built on a single silicon wafer made from a monocrystalline silicon boule. The typical manufacturing process for such monolithic ICs is called a planar process, allowing photolithography, etching, heat diffusion, oxidation, and other such processes to occur on the surface of the wafer, such that active circuit elements (e.g., transistors and diodes) are formed on the planar surface of the silicon wafer.

Current technologies permit hundreds and thousands of such active circuit elements to be formed on a single die so that numerous logic circuits may be enabled thereon. In such monolithic dies, the manufacturing process must be optimized for all the circuits equally, resulting in trade-offs between different circuits. In addition, because of the limitation of having to place circuits on a planar surface, some circuits are farther apart from some others, resulting in decreased performance such as longer delays. The manufacturing yield may also be severely impacted because the entire die may have to be discarded if even one circuit is malfunctional.

One solution to overcome such negative impacts of monolithic dies is to disaggregate the circuits into smaller dies (e.g., chiplets, tiles) electrically coupled by interconnect bridges. The smaller dies are part of an assembly of interconnected dies that together form a complete IC in terms of application and/or functionality, such as a memory chip, microprocessor, microcontroller, commodity IC (e.g., chip used for repetitive processing routines, simple tasks, application specific IC, etc.), and system-on-a-chip (SoC). In other words, the individual dies are connected to create the functionalities of a monolithic IC. By using separate dies, each individual die can be designed and manufactured optimally for a particular functionality. For example, a processor core that contains logic circuits might aim for performance, and thus might require a very speed-optimized layout. This has different manufacturing requirements compared to a USB controller, which is built to meet certain universal serial bus (USB) standards, rather than for processing speed. Thus, by having different parts of the overall design separated into different dies, each one optimized in terms of design and manufacturing, the overall yield and cost of the combined die solution may be improved.

The connectivity between these dies is achievable by many ways. For example, in 2.5D packaging solutions, a silicon interposer and through-silicon vias (TSVs) connect dies at silicon interconnect speed in a minimal footprint. In another example, a silicon bridge embedded under the edges of two interconnecting dies facilitates electrical coupling between them. In a three-dimensional (3D) architecture, the dies are stacked one above the other, creating a smaller footprint overall. Typically, the electrical connectivity and mechanical coupling in such 3D architecture is achieved using TSVs and high pitch solder-based bumps (e.g., C2 interconnections). The bridge and the 3D stacked architecture may also be combined to allow for top-packaged chips to communicate with other chips horizontally using the bridge and vertically, using Through-Mold Vias (TMVs) which are typically larger than TSVs. However, these current interconnect technologies use solder or its equivalent for connectivity, with consequent low vertical and horizontal interconnect density.

One way to mitigate low vertical interconnect density is to use an interposer, which improves vertical interconnect density but suffers from low lateral interconnect density if the base wafer of the interposer is passive. In a general sense, an "interposer" is commonly used to refer to a base piece of silicon that interconnects two dies. By including active circuit elements in the interposer, lateral speeds may be improved, but it requires more expensive manufacturing processes, in particular when a large base die is used to interconnect smaller dies. Additionally, not all interfaces require fine pitch connections which may lead to additional manufacturing and processing overheads without the benefits of the fine pitch.

Integrating optical communications to IC packages further increases the complexity. Contemporary optical communications and other systems often employ PICs. Smaller, faster, and less expensive optical elements can enable universal, low-cost, high-volume optical communications needed for fast and efficient communication technologies demanded by high volume internet data traffic. In optical communications, information is transmitted by way of an optical carrier whose frequency typically is in the visible or near-infrared region of the electromagnetic spectrum. A carrier with such a high frequency is sometimes referred to as an optical signal, an optical carrier, a light wave signal, or simply light. A typical optical communications network includes several optical fibers, each of which may include several channels. A channel is a specified frequency band of an electromagnetic signal and is sometimes referred to as a wavelength. Technological advances today enable implementing portions of optical communication systems at the IC (or chip or die) level in PICs. Packaging such PICs presents many challenges.

In a general sense, a PIC integrates photonic functions for information signals imposed on electromagnetic waves, e.g., electromagnetic waves of optical wavelengths. PICs find application in fiber-optic communication, medical, security, sensing, and photonic computing systems. The PIC may implement one or more optical and electro-optical devices such as lasers, photodetectors, waveguides, and modulators on a single semiconductor chip. In addition, the PIC may also include electrical circuitry to process electrical signals corresponding to these optical signals. Such integrated PICs have both photonic processing and electrical signal processing in a same process node which may limit optimization. In other embodiments, PIC may be in a separate process node that optimizes PIC performance and electrical signal processing may be in a different process node that optimizes the electrical high-speed performance.

Packaging the PIC is not trivial. Among the challenges is a need for parallel tight-pitch interconnects that enable high density, high bandwidth electrical communication between the PIC and other electrical devices, such as processor integrated circuits (XPU), also referred to herein as "processor IC," and electrical integrated circuits (EIC) with simultaneous optical access to the PIC for the optical signals. Indeed, getting optical signals into and out of PICs is a driver of manufacturing cost and complexity. In addition, exchanging optical signals between a PIC and an external source can be difficult and is generally a permanent connection that includes "fiber pigtails." Fiber pigtails are fragile and susceptible to cracking, which presents manufacturing and handling challenges that commonly result in reduced yields and end-of-use failures. Another way to couple a PIC to a fiber is to implement edge-coupling by using an optical coupling structure (OCS) (sometimes referred to as "fiber connector," "fiber assembly unit" (FAU), or "fiber array block") that has one end coupled to a fiber and an opposite end placed proximate to a PIC die (i.e., a die that houses one or more PICs) so that electromagnetic signals may be exchanged between the PICS of the PIC die and the fiber, via the OCS. Because the signals require a transparent medium for propagation, the PIC are typically exposed in the package to allow the fiber to be coupled to the PIC with sufficient stability even in such edge-coupled assemblies. For example, in some packaging architectures, the PIC has an overhang to couple to the fiber which presents at the edge of the package.

In one aspect of the present disclosure, a thin glass core may be incorporated into a package substrate. A glass core as compared to a conventional epoxy core offers several advantages including higher plated-through hole (PTH) density, lower signal losses, and lower total thickness variation (TTV), among others. Additional functionality is achievable by inserting a waveguide in a glass core for optical transmission through the core. A PIC requires both electrical and optical connections to the package substrate. A dielectric material with conductive pathways therein may be formed on a surface of the glass core, such that, a PIC may be nested in a cavity in the dielectric material and electrically coupled to an EIC and/or XPU by the conductive pathways through the dielectric material and optically coupled to an external FAU by an optical pathway through the glass core. A dielectric material including conductive pathways also may be referred to herein as a redistribution layer (RDL).

An example photonic IC package architecture disclosed herein may further include coupling a plurality of PICS, EICs, PICs, and/or interconnect dies using high-density interconnects. As used herein, "high-density interconnects" include interconnects having a pitch of less than 10 microns. As used herein, pitch is measured center-to-center (e.g., from a center of an interconnect to a center of an adjacent interconnect). The terms "interconnect die," "bridge die," "bridge," "interconnect bridge" may be used interchangeably herein.

Accordingly, microelectronic assemblies, related devices and methods, are disclosed herein. In some embodiments, a microelectronic assembly may include a substrate having a glass core with a surface and a dielectric material on a portion of the surface of the core, the dielectric material including conductive pathways; a PIC having an active surface, wherein the PIC is coupled to the surface of the core with the active surface facing away from the core; an XPU electrically coupled to the conductive pathways in the dielectric material and to the active surface of the PIC; a first optical component optically coupled to a lateral surface of the PIC and to the surface of the core; and a second optical component coupled to the core, wherein the second optical component is optically coupled to the PIC by an optical pathway through the first optical component and the core. In other embodiments, a microelectronic assembly may include a substrate having a glass core with a surface and a dielectric material on a portion of the surface of the core, the dielectric material including conductive pathways and an interconnect die; an XPU and a PIC, having an active surface facing towards the core, electrically coupled to the interconnect die and to the conductive pathways; a first optical component optically coupled to the active surface of the PIC and to the surface of the core; and a second optical component coupled to the core, wherein the second optical component is optically coupled to the PIC by an optical pathway through the first optical component and the core.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material (e.g., substrate, body) on which integrated circuits are fabricated with traditional semiconductor processing methods. The semiconductor base material may include, for example, N-type or P-type materials. Dies may include, for example, a crystalline base material formed using a bulk silicon (or other bulk semiconductor material) or a silicon-on-insulator (SOI) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In another example, the terms "package" and "IC package" are synonymous, as are the terms "die" and "IC die." Note that the terms "chip," "chiplet," "die," and "IC die" are used interchangeably herein.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" or "insulator" (also called herein as "dielectric material" or "dielectric") refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon carbide, silicon carbonitride, silicon nitride, and alumina or a combination thereof. They may include dielectric materials, high polarizability materials, and/or piezoelectric materials. A dielectric material may include any suitable dielectric material commonly used in semiconductor manufacture, such as silicon and one or more of oxygen, nitrogen, hydrogen, and carbon (e.g., in the form of silicon oxide, silicon nitride, silicon oxynitride, or silicon carbon nitride); a polyimide material; or a low-k or ultra low-k dielectric (e.g., carbon-doped dielectrics, fluorine-doped dielectrics, porous dielectrics, organic polymeric dielectrics, photo-imageable dielectrics, and/or benzocyclobutene-based polymers). They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field-effect transistors (FETs), e.g., MOSFETs. In many embodiments, an FET is a four-terminal device. In silicon-on-insulator, or nanoribbon, or gate all-around (GAA) FET, the FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a PIC, "interconnect" may also describe any element formed of a material that is optically conductive for providing optical connectivity to one or more elements associated with the PIC. In such cases, the term "interconnect" may refer to optical waveguides, including optical fiber, optical splitters, optical combiners, optical couplers, and optical vias.

As used herein, the term "optical element" includes arrangements of forms fabricated in ICs to receive, transform and/or transmit optical signals as described herein. It may include optical conductors such as waveguides, grating coupler, electromagnetic radiation sources such as lasers, and electro-optical devices such as photodetectors.

The term "waveguide" refers to any structure that acts to guide the propagation of light from one location to another location typically through a substrate material such as silicon or glass. In various examples, waveguides can be formed from silicon, doped silicon, silicon nitride, glasses such as silica (e.g., silicon dioxide or $SiO_2$), borosilicate (e.g., 70-80 wt % $SiO_2$, 7-13 wt % of $B_2O_3$, 4-8 wt % $Na_2O$ or $K_2O$, and 2-8 wt % of $Al_2O_3$) and so forth. Waveguides may be formed using various techniques including but not limited to forming waveguides in situ. For example, in some embodiments, waveguides may be formed in situ in glass using low temperature glass-to-glass bonding or by laser direct writing (e.g., a laser written waveguide). Waveguides formed in situ may have lower loss characteristics.

The term "conductive trace" may be used to describe an electrically conductive element isolated by an insulating material. Within IC dies, such insulating material comprises interlayer low-k dielectric that is provided within the IC die. Within package substrates, and printed circuit boards (PCBs) such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "package substrate" may be used to describe any substrate material that facilitates the packaging together of any collection of semiconductor dies and/or other electrical components such as passive electrical components. As used herein, a package substrate may be formed of any material including, but not limited to, insulating materials such as resin impregnated glass fibers (e.g., PCB or Printed Wiring Boards (PWB)), glass, ceramic, silicon, silicon carbide, etc. In addition, as used herein, a package substrate may refer to a substrate that includes buildup layers (e.g., ABF layers).

The term "metallization stack" may be used to refer to a stack of one or more interconnects for providing connectivity to different circuit components of an IC die/chip and/or a package substrate.

As used herein, the term "pitch" of interconnects refers to a center-to-center distance between adjacent interconnects.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

Note that in the figures, various components (e.g., interconnects) are shown as aligned (e.g., at respective interfaces) merely for ease of illustration; in actuality, some or all of them may be misaligned. In addition, there may be other components, such as bond-pads, landing pads, metallization, etc. present in the assembly that are not shown in the figures to prevent cluttering. Further, the figures are intended to show relative arrangements of the components within their assemblies, and, in general, such assemblies may include other components that are not illustrated (e.g., various interfacial layers or various other components related to optical functionality, electrical connectivity, or thermal mitigation). For example, in some further embodiments, the assembly as shown in the figures may include more dies along with other electrical components. Additionally, although some components of the assemblies are illustrated in the figures as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

For convenience, if a collection of drawings designated with different letters are present (e.g., FIGS. 1A-1E), such a collection may be referred to herein without the letters (e.g., as "FIG. 1"). Similarly, if a collection of reference numerals designated with different numerals or letters are present (e.g., 104-1, 104-2), such a collection may be referred to herein without the numerals or letters (e.g., as "104").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

FIG. 1A is a schematic cross-sectional view of an example microelectronic assembly 100 according to some embodiments of the present disclosure. Microelectronic assembly 100 comprises a PIC 104, an optical component 182, a core 103, and a fiber connector 187, where PIC 104 is optically coupled to the fiber connector 187 by an optical pathway 160 through the optical component 182 and the core 103. As used herein, the terms "microelectronic assembly," "photonic package," "photonic microelectronic assembly," and similar variations may be used interchangeably. As used herein, the term "optical pathway" refers to a path or trajectory by which light propagates from one location to another location through an optical medium. In some embodiments, an optical pathway 160 may include one or more waveguides or other structures that guide the path of light. Optical pathway 160 may include a first portion through optical component 182 and a second portion through the core 103. For example, optical pathway 160 may include a first portion through optical component 182 that does not have a waveguide (e.g., a passthrough structure, a) and a second portion through the core 103 that has a waveguide. In another example, optical pathway 160 may include a first waveguide in the first portion through optical component 182 that is optically coupled to a second waveguide in the second portion through the core 103. In some embodiments, the optical pathway 160 may include a reflector or other component configured to transmit a signal from a vertical direction to a lateral direction or from a lateral direction to a vertical direction. In some embodiments, a material of the core 103 may include glass. For example, a core 103 may include any suitable type of glass known in the art, including but not limited to photoglass, borosilicate glass, soda lime glass, quartz, a fused-silica glass, an alkali glass, or other glass material. In some embodiments, the core 103 may include a photoimageable glass, or other borosilicate-based glasses with oxide additions. The core 103 may include a first surface 170-1 (e.g., a bottom surface), an opposing second surface 170-2 (e.g., a top surface), and a lateral surface 170-3 substantially perpendicular to the first and second surfaces 170-1, 170-2. A thickness of the core 103 (e.g., z-height) may be between 20 microns and 2 millimeters.

Optical component 182 may be physically and optically coupled to the second surface 170-2 of the core 103 and to an active surface 105 of PIC 104. Examples of optical components 182 include any suitable optical structures for propagating optical signals, such as, a glass block, a glass block with a reflector, a glass block with a curved surface, a glass block with a mirror reflector, a glass block with a multi-directional reflector, a glass block with a waveguide, a glass block with a laser written waveguide, an optical lens, a micro-lens, a gradient-index (GRIN) lens, and combinations thereof. In some embodiments, a material of the optical component 182 may include glass, as described above with reference to the core 103, or a polymer material that suitable for optical signal transmission with minimal loss (e.g., an optically compatible polymer). Optical component 182 may be physically coupled to the core 103 and to PIC 104 using any suitable attachment means, for example, optical glue or fusion bonding. Optical glue may include any suitable material that permits optical signals to pass through while serving to adhere optical component 182 to PIC 104 and core 103. The materials may include, by way of examples, and not as limitations, ultraviolet curing optical adhesives, epoxies, silicone, modified silane, and acrylates. The optical component 182, PIC 104, and the core 103 may be aligned at the bonding interfaces to minimize optical loss across the optical pathway 160. Bonding surfaces of optical component 182 (e.g., top and side surfaces) and core 103 (e.g., top surface 170-2) may be ground and polished to suitable surface quality enabling optical interconnection with no substantial loss in optical signal integrity across bonding interfaces. In some embodiments, index matching epoxy or an anti-reflective material may be used to further reduce optical loss. For glass-to-glass bonding interface (e.g., glass block to glass core 103 or glass block to PIC 102), alignment may not be required as the glass block may be configured for beam expansion and optical loss is likely to be minimal, or an optical pathway 160 may be formed subsequent to attachment (e.g., in situ laser written waveguide). Fusion bonding may include a layer of bonding material, such as alumina, optical epoxy, or silicon oxide, on a bonding surface. In some embodiments, the bonding material may cover optical elements on active surface 105 and may function as a protective layer that maintains integrity of the optical elements during fabrication processes to which PIC 104 may be subjected, for example, attaching, solder reflowing, grinding, polishing, underfilling, and molding. The layer of bonding material may ensure, for example, that optical transmission properties of the optical elements are not compromised during the fabrication processes by contamination with mold or underfill material, or that optical functionality is not compromised by tearing, breaking, or other destructive events during the fabrication processes. The layer of bonding material may also serve to avoid leaking optical signals from the optical elements, including waveguide 164, during operation of PIC 104. For example, the bonding material may further serve to provide oxide-to-oxide bonding between the optical elements of PIC 104 and the optical component 182 when a silicon oxide material is used. In another example, the bonding material may serve to provide nitride-to-nitride bonding between the optical elements of PIC 104 and the optical component 182 when a silicon nitride material is used. The silicon oxide layers in oxide-to-oxide bonding, or the silicon nitride layers in nitride-to-nitride bonding, may be bonded initially by Vander-Waals forces and subsequently by high temperature fusion bonding. The oxide-to-oxide bonding and nitride-to-nitride bonding may decrease optical signal losses. Although only a single optical component 182 is shown in FIG. 1A, optical component 182 may comprise an array of multiple such optical components situated proximate to active surface 105 of PIC 104. In an example embodiment, an array may comprise 12 to 24 such optical components. In another example, an array may be a two-dimensional (2D) array.

A fiber connector 187 may be optically coupled to a core 103. As shown in FIG. 1A, a fiber connector 187 may be at a lateral surface 170-3 (e.g., a side surface) of the core 103 and optically coupled to the optical pathway 160 in the core 103. In some embodiments, a fiber connector 187 may be physically coupled to core 103 using any suitable attachment means, for example, mechanical retention components, such as a plug or socket, or by optical glue or fusion bonding, as described above with reference to optical component 182. FIGS. 1D and 1E are detailed, schematic cross-sectional views of example fiber connectors 187 of FIG. 1A. As shown in FIG. 1D, a fiber connector 187 may include a GRIN lens 183 and a single mode fiber 186 in an FAU housing 188. As shown in FIG. 1E, a fiber connector 187 may include a single mode fiber 186 and a micro array lens 185 in an FAU housing 188.

The microelectronic assembly 100 may further include a first RDL 148-1 on the first surface 170-1 of the core 103 and a second RDL 148-2 on a portion of the second surface 170-2 of the core 103. The first and second RDLs 148-1, 148-2 may include conductive pathways 196 (e.g., including conductive traces and/or conductive vias, as shown) through a dielectric material. The RDLs 148 may include a set of first conductive contacts 172 on the bottom surface of the RDL 148 and a set of second conductive contacts 174 on the top surface of the RDL 148, where the conductive pathways 196 electrically couple individual ones of the first and second conductive contacts 172, 174. The first and second RDLs 148-1, 148-2 may be manufactured using any suitable technique, such as a PCB technique or a redistribution layer technique. In some embodiments, a dielectric material of the RDL 148 may include an oxide material, such as silicon and oxygen (e.g., in the form of silicon oxide), a nitride material, such as or silicon and nitrogen (e.g., in the form of silicon nitride), or an organic material. The core 103 may further include one or more through-glass vias (TGVs) 110 electrically coupling the first and second RDLs 148-1, 148-2. As used herein, the core 103 with the second RDL 148-2 and/or the first RDL 148-1 may be referred to as a package substrate. The TGVs 110 in the core 103 may be formed of any appropriate conductive material, such as copper, silver, nickel, gold, aluminum, or other metals or alloys, for example. The TGVs 110 may be formed using any suitable process, including, for example, a direct laser drilling or laser induced deep etching process. In some embodiments, the TGVs 110 disclosed herein may have a pitch between 50 microns and 500 microns. As used herein, pitch is measured center-to-center (e.g., from a center of a TGV to a center of an adjacent TGV). The TGVs 110 may have any suitable size and shape. In some embodiments, the TGVs 110 may have a circular, rectangular, or other shaped cross-section.

Figure 4:
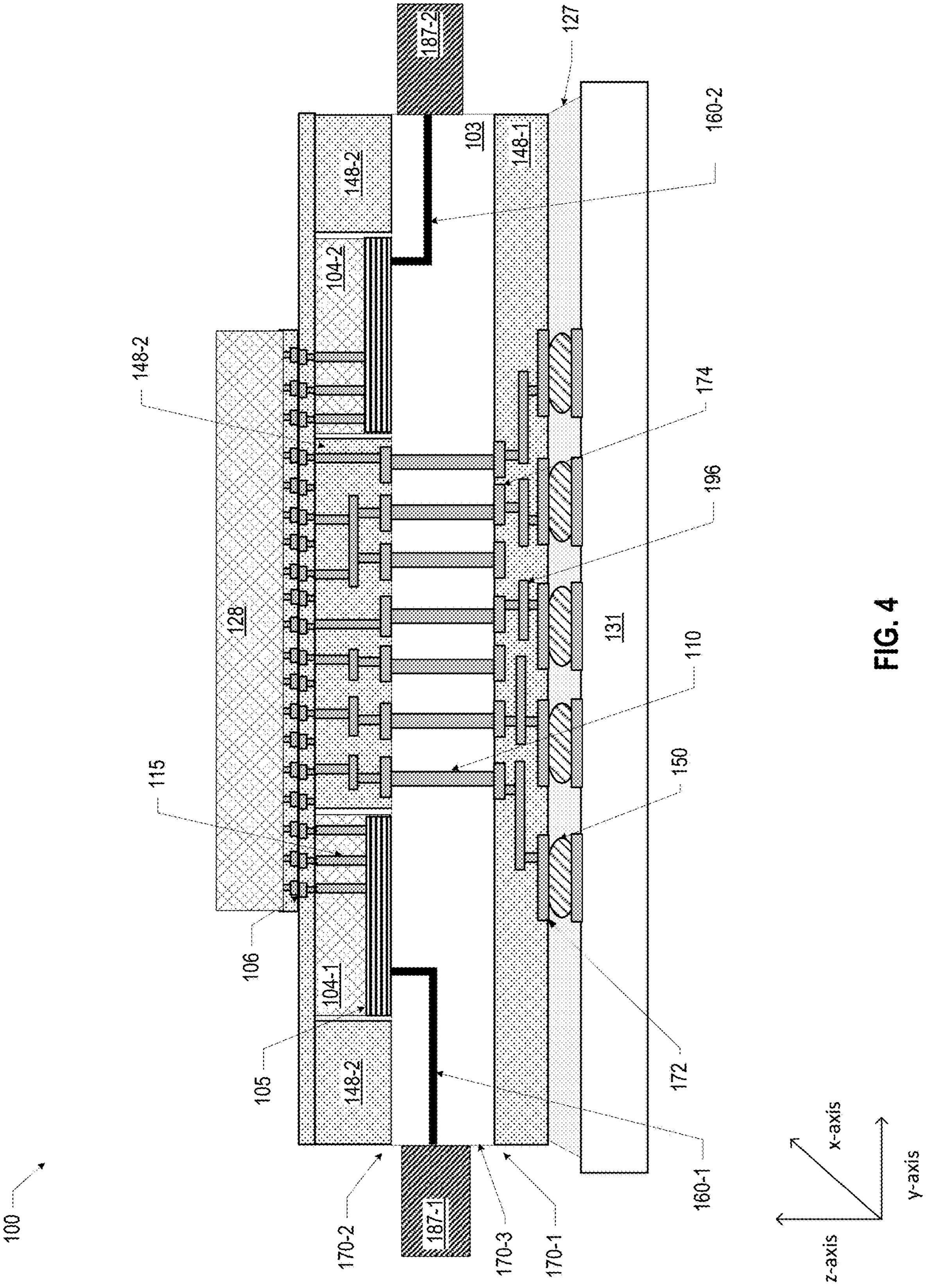
FIG. 4 is a schematic cross-sectional view of another example microelectronic assembly according to some embodiments of the present disclosure.

PIC 104 may include an active surface 105, as described above. A first portion of active surface 105 of PIC 104 may be fused or bonded to the optical component 182 and a second portion of active surface 105 may include conductive contacts 122 on a bottom surface of PIC 104 that may be electrically and mechanically coupled to the second conductive contacts 174 on the top surface of the second RDL 148-2 by interconnects 150. A first portion of active surface 105 of the PIC 104 may include optical elements. Example optical elements over the first portion of active surface 105 are shown in more detail in FIG. 1B. FIG. 1B is a schematic of a face of active surface 105 (e.g., looking at the active surface 105 of the PIC 104). Example optical elements include an electromagnetic radiation source 166, an electro-optical device 168, and a waveguide 164. In many embodiments, the optical elements may be fabricated on active surface 105 using any known method in the art, including semiconductor photolithographic and deposition methods. In some embodiments, the optical elements may extend substantially across an entire area of active surface 105 (not shown). In some embodiments, the optical elements may be confined within a portion of active surface 105. In some embodiments, a PIC 104 may be configured to transmit and/or receive an optical signal at a lateral surface, as shown in FIG. 1A. In such examples, PIC 104 may include optical elements, such as an edge coupler, a v-groove array, or an angled reflector with a grating coupler, at an active surface 105 that allow PIC 104 to transmit and/or receive light through a lateral surface that is substantially perpendicular to the active surface 105 (e.g., lateral transmission and reception of light). In some embodiments, a PIC 104 may be configured to transmit and/or receive an optical signal at an active surface 105, as shown in FIG. 4. For example, PIC 104 may include optical elements, such as a grating coupler, at an active surface 105 that allow PIC 104 to transmit and/or receive light through the active surface 105 (e.g., vertical transmission and reception of light).

Electromagnetic radiation source 166 can enable generating optical signals and may include lasers, for example if PIC 104 supports wavelengths between about 0.8 and 1.7 micrometer. Electro-optical device 168 can enable receiving, transforming, and transmitting optical signals. In some embodiments, electro-optical device 168 may be any device or component configured to encode information in/onto the electromagnetic signals, such as modulator, polarizer, phase shifter, and photodetector.

Waveguide 164 can guide optical signals and also perform coupling, switching, splitting, multiplexing and demultiplexing optical signals. In some embodiments, waveguide 164 may include any component configured to feed, or launch, the electromagnetic signal into the medium of propagation such as an optical fiber. In some embodiments, waveguide 164 may further be configured as optical multiplexers and/or demultiplexers, for example, to perform wavelength division multiplexing (WDM). In some embodiments, waveguide 164 may include a de-multiplexer, such as Arrayed Waveguide Grating (AWG) de-multiplexer, an Echelle grating, a single-mode waveguide, or a thin film filter (TFF) de-multiplexer. Waveguide 164 may comprise planar and non-planar waveguides of any type. In one example, waveguide 164 may comprise a silicon photonic waveguide based on silicon-on-isolator (SOI) platform, configured to guide electromagnetic radiation of any wavelength bands from about 0.8 micrometer to about 5.0 micrometer. In another example, waveguide 164 may support wavelengths from about 1.2 micrometer to about 1.7 micrometer in the near infrared and infrared bands for use in data communications and telecommunications.

Although only three such example optical elements are illustrated in FIG. 1B, it may be understood that PIC 104 may include more optical elements of the same or different types that enable it to function appropriately as a photonic device receiving, transforming, and transmitting optical and electrical signals.

In general, the light provided to PIC 104 may include any electromagnetic signals having information encoded therein (or, phrased differently, any electromagnetic signals modulated to include information). Often times, the electromagnetic signals are signals associated with optical amplitudes, phases, and wavelengths and, therefore, descriptions provided herein refer to "optical" signals (or light) and "optical" components. However, photonic microelectronic assembly 100 with PIC 104, as described herein, are not limited to operating with electromagnetic signals of optical spectrum and descriptions provided herein with reference to optical signals and/or optical elements are equally applicable to electromagnetic signals of any suitable wavelength, such as electromagnetic signals in near-infrared (NIR) and/or infrared (IR) bands, as well as electromagnetic signals in the RF and/or microwave bands.

PIC 104 may comprise a semiconductor material including, for example, N-type or P-type materials. PIC 104 may include, for example, a crystalline substrate formed using a bulk silicon (or other bulk semiconductor material) or a SOI structure (or, in general, a semiconductor-on-insulator structure). In some embodiments, PIC 104 may be formed using alternative materials, which may or may not be combined with silicon, that include, but are not limited to, lithium niobite, indium phosphide, silicon dioxide, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. In some embodiments, PIC 104 may comprise a non-crystalline material, such as polymers. In some embodiments, PIC 104 may be formed on a printed circuit board (PCB). In some embodiments, PIC 104 may be inhomogeneous, including a carrier material (such as glass or silicon carbide) as a substrate with a thin semiconductor layer over which is active surface 105. Although a few examples of the material for PIC 104 are described here, any material or structure that may serve as a foundation upon which PIC 104 may be built falls within the spirit and scope of the present disclosure.

A microelectronic assembly 100 may further include EIC 114, XPU 128, and a bridge die 202. A bridge die 202 may be at least partially nested in a cavity in a dielectric material of the second RDL 148-2. The bridge die 202 may be electrically coupled to EIC 114 and XPU 128 by interconnects 130. PIC may be electrically coupled to EIC 114 by interconnects 130. In particular, conductive contacts 122 on the bottom surface of XPU 128 and EIC 114 may be electrically and mechanically coupled to the conductive contacts 124 on the top surface of the bridge die 202 by interconnects 130; conductive contacts 122 on the bottom surface of XPU 128 and EIC 114 may be electrically and mechanically coupled to the conductive contacts 124 on the top surface of the second RDL 148-2 by interconnects 130; and conductive contacts 124 on the active surface 105 of PIC 102 may be electrically coupled to conductive contacts 122 on a bottom surface of EIC 114 by interconnects 130. Interconnects 130 may enable electrical coupling between PIC 104, EIC 114, bridge die 202, and XPU 128. Interconnects 130 disclosed herein may take any suitable form, including solder balls for a ball grid array arrangement, pins in a pin grid array arrangement or lands in a land grid array arrangement. In some embodiments, a set of interconnects 130 may include solder 132 (e.g., solder bumps or balls that are subject to a thermal reflow to form the interconnects 130). Interconnects 130 that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of interconnects 130 may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression. In some embodiments, interconnects 130 disclosed herein may have a pitch between about 20 microns and 150 microns (for example, between 20 microns and 75 microns, or between 75 microns and 150 microns).

A bridge die 202 may comprise appropriate circuitry on/in a semiconductor substrate to connect at silicon-interconnect speeds with a small footprint. In some embodiments, bridge die 202 may comprise active components, such as transistors and diodes in addition to bridge circuitry including metallization traces, vias and passive components for enabling electrical coupling between two ICs; in other embodiments, bridge die 202 may include bridge circuitry including metallization traces, vias and passive components for enabling electrical coupling between EIC 114 and XPU 128, and may not include active components.

EIC 114 may comprise an IC configured to electrically integrate with PIC 104 to achieve an intended functionality of photonic package 100. For example, EIC 114 may be an Application Specific IC (ASIC), including one or more switch or driver/receiver circuits used in optical communication systems. In some embodiments, EIC 114 may include circuitry for communicating between two or more IC dies, for example, EIC 114 may function as an embedded multi-die interconnect bridge having appropriate circuitry on/in a semiconductor substrate to connect at silicon-interconnect speeds with a small footprint as part of an Omni-Directional Interface (ODI) architecture, for example, of 2.5D packages. In some embodiments, EIC 114 may comprise active components, including one or more transistors, voltage converters, trans-impedance amplifiers (TIA), serializer and deserializer (SERDES), clock and data recovery (CDR) components, microcontrollers, etc. In some embodiments, EIC 114 may comprise passive circuitry sufficient to enable interconnection to PIC 104 and other components in photonic package 100 without any active components. In some embodiments, EIC 114 may extend under a substantial area of PIC 104. In various embodiments, EIC 114 and PIC 104 may overlap sufficiently to enable disposing interconnects 130 with a desired pitch and number of interconnections that enable photonic package 100 to function appropriately.

Figure 2A:
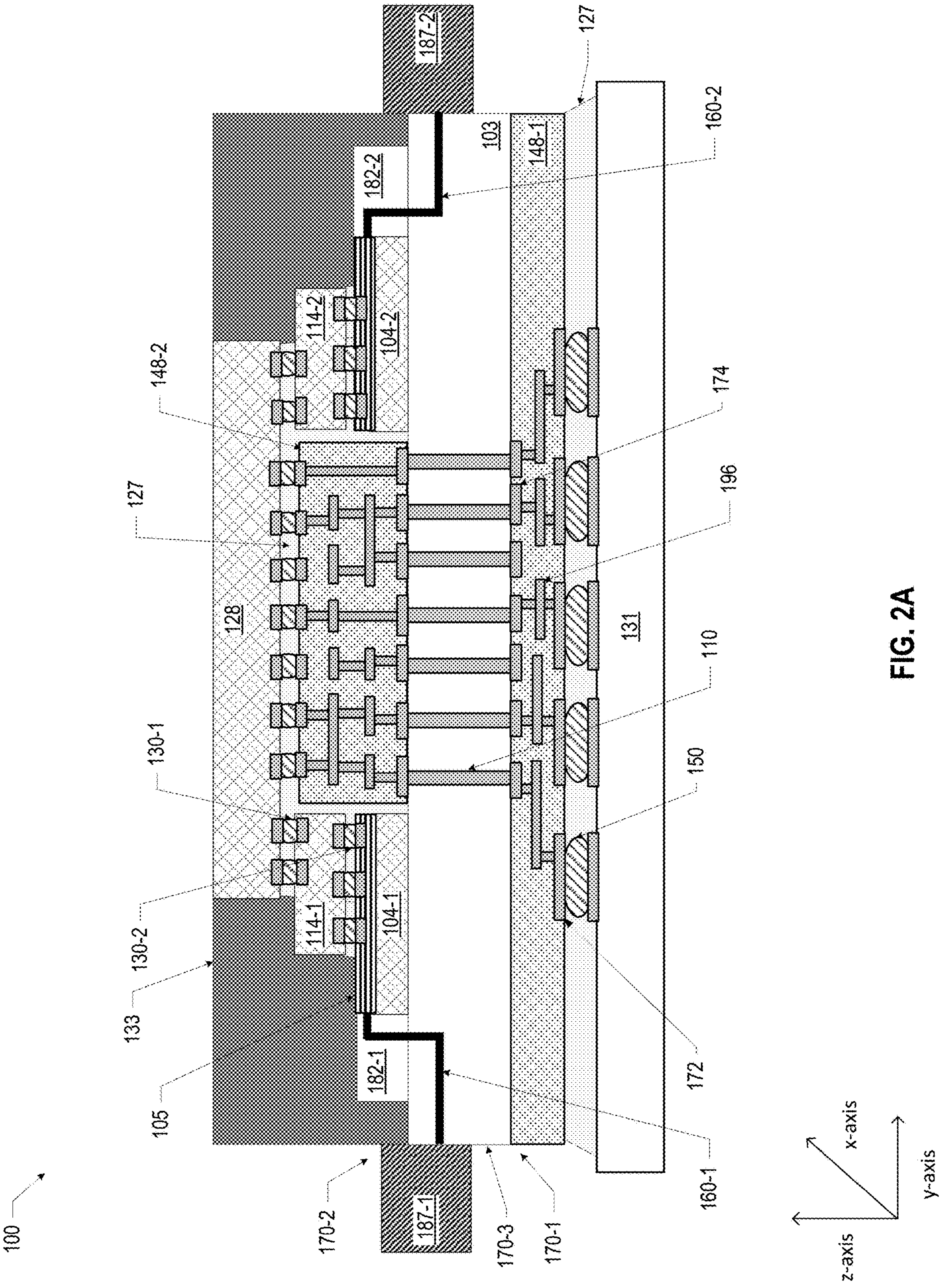
FIG. 2A is a schematic cross-sectional view of another example microelectronic assembly according to some embodiments of the present disclosure.

XPU 128 may comprise any suitable integrated chip with processing functionality, such as Central Processing Unit (CPU), Graphics Processing Unit (GPU), Field-Programmable Gate Array (FPGA), ASIC, and accelerator. In various embodiments, XPU 128 may be, or include, one or more voltage converters, Trans Impedance Amplifier (TIA), Clock and Data Recovery (CDR) components, microcontrollers, etc. Although FIG. 1A shows XPU 128 and EIC 114 as separate ICs, in some embodiments, XPU 128 may include EIC functionality, such that a microelectronic assembly 100 may include XPU 128 and may not include a separate EIC 114 (e.g., as shown in FIG. 2A). Although FIG. 1A shows XPU 128 as a single IC, in some embodiments, XPU 128 may include multiple ICs coupled by interconnects 130.

The microelectronic assembly 100 of FIG. 1A may also include an underfill material 127. In some embodiments, the underfill material 127 may extend between EIC 114 and XPU 128 and the second RDL 148-2 around the associated interconnects 130. An underfill material 127 may be disposed around interconnects 130 and may further fill the space between EIC 114 and core 103 (e.g., between PIC 104 and the second RDL 148-2, and the second surface 170-2 of the core 103). The underfill material 127 may be an insulating material, such as an appropriate epoxy material. In some embodiments, the underfill material 127 may include a capillary underfill, non-conductive film (NCF), or molded underfill. In some embodiments, the underfill material 127 may include an epoxy flux that assists with soldering PIC 104 to EIC 114 and EIC 114 and XPU 128 to the second RDL 148-2 when forming the interconnects 130, and then polymerizes and encapsulates the interconnects 130. The underfill process may include dispensing underfill material in liquid form, allowing the material to flow and fill the space between EIC 114 and core 103 and the interstitial gaps around interconnects 130, and subjecting the assembly to a curing process, such as baking, to solidify the material. In some embodiments, an underfill material 127 may be omitted or may not fill the space between EIC 114 and core 103. Although FIG. 1A shows two separate underfill 127 portions under EIC 114 and XPU 128, the underfill 127 may be a single underfill 127 under EIC 114 and XPU 128. The underfill material 127 may be selected to have a coefficient of thermal expansion (CTE) that may mitigate or minimize the stress between EIC 114 and XPU 128, and the second RDL 148-2 arising from uneven thermal expansion in the microelectronic assembly 100. In some embodiments, the CTE of the underfill material 127 may have a value that is intermediate to the CTE of the second RDL 148-2 (e.g., the CTE of the dielectric material of the RDL 148) and a CTE of the insulating material of EIC 114 and/or XPU 128.

The microelectronic assembly 100 of FIG. 1A may also include a circuit board 131. In particular, conductive contacts 172 on a bottom surface of the first RDL 148-1 may be electrically coupled to conductive contacts 146 on a top surface of circuit board 131 by interconnects 150. Interconnects 150 disclosed herein may take any suitable form, including any of the forms described above with reference to interconnects 130. As shown in FIG. 1A, in some embodiments, a set of interconnects 150 may include solder 136 (e.g., solder bumps or balls that are subject to a thermal reflow to form the interconnects 150). In some embodiments, the interconnects 150 disclosed herein may have a pitch between about 50 microns and 300 microns. In some embodiments, an underfill material 127 may extend between the first RDL 148-1 and the circuit board 131 around the associated interconnects 150. The circuit board 131 may be a motherboard, for example, and may have other components attached to it. The circuit board may include conductive pathways and other conductive contacts for routing power, ground, and signals through the circuit board, as known in the art. In some embodiments, the interconnects 150 may not couple to a circuit board 131, but may instead couple to another IC package, an interposer, or any other suitable component.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photoimageable polymers. In some embodiments, solder resist may be non-photoimageable.

Figure 1C:
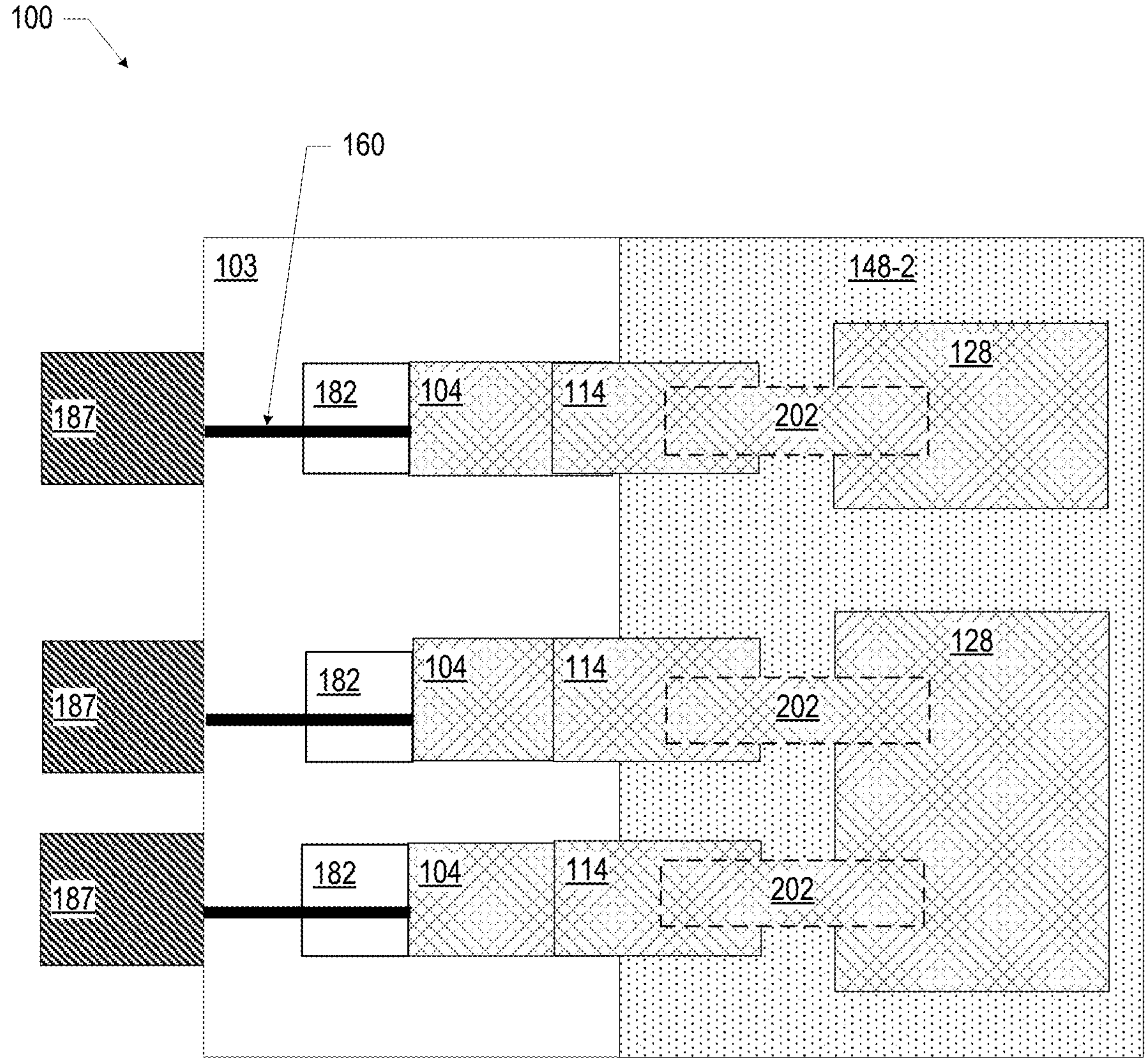
FIG. 1C is a schematic top view of the example microelectronic assembly of FIG. 1A.
Figure 1D:
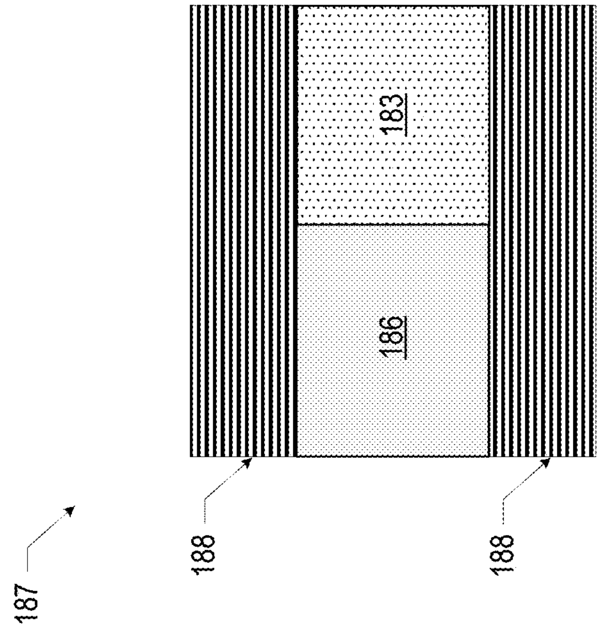
FIGS. 1D and 1E are detailed, schematic cross-sectional views of example optical components of the microelectronic assembly of FIG. 1A.
Figure 1E:
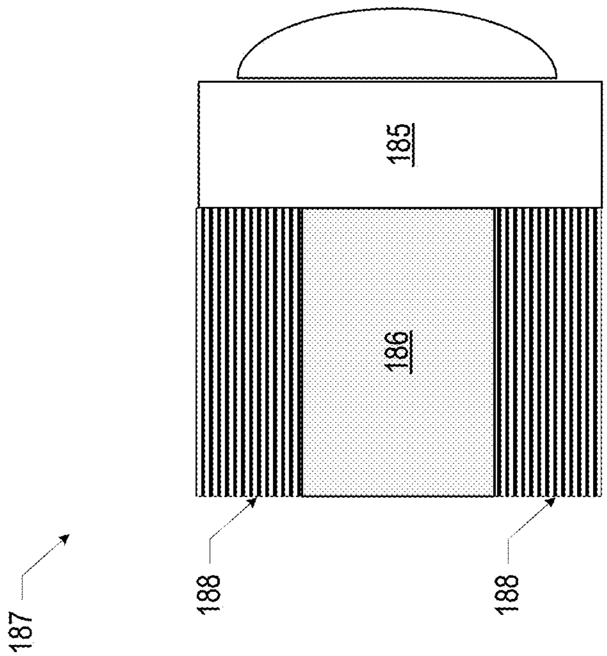

FIG. 1C is a top view of the microelectronic assembly of FIG. 1A. As shown in FIG. 1C, the microelectronic assembly 100 may include a plurality of XPUs 128 and a plurality of EICs 114 electrically coupled to an RDL 148-2 and one or more bridges die 202 (e.g., the dotted lines indicating that the one or more bridge dies are below XPUs 128 and EICs 114), and a plurality of optical components 182 optically attached or bonded to PIC 104 and a core 103, and a plurality of fiber connectors 187. As shown in FIG. 1C, individual ones of optical components 182 are coupled to individual ones of PICs 104. Individual ones of PIC 104 may be optically coupled to individual ones of the fiber connectors 187 by optical pathways 160. In some embodiments, one or more EICs 114 may be electrically coupled to XPU 128 by one or more bridge dies 202. Although FIG. 1C shows the microelectronic assembly 100 having two XPUs 128, three EICs 114, three bridge dies 202, three PICs 104, three optical components 182, and three fiber connectors 187, a microelectronic assembly 100 may have any suitable number and arrangement of XPUs 128, EICs 114, bridge dies 202, PICs 104, optical components 182, and fiber connectors 187, and any suitable number and arrangement electrical and optical connections therebetween.

FIG. 2A is a schematic cross-sectional view of another example microelectronic assembly according to some embodiments of the present disclosure. The configuration of the embodiment shown in the figure is like that of FIG. 1A, except for differences as described further. The configuration of microelectronic assembly 100 as described herein includes first and second EICs 114, first and second PICs 104-1, 104-2, first and second optical components 182-1, 182-2, and first and second fiber connectors 187-1, 187-2, where first PIC 104-1 is optically coupled to the first fiber connector 187-1 by a first optical pathway 160-1 through the first optical component 182-1 and the core 103, and the second PIC 104-2 is optically coupled to the second fiber connector 187-2 by a second optical pathway 160-2 through the second optical component 182-2 and the core 103. First PIC 104-1 may be electrically coupled to first EIC 114-1 by interconnects 130-2 and first EIC 114-1 may be electrically coupled to XPU 128 by interconnects 130-1. Second PIC 104-2 may be electrically coupled to second EIC 114-2 by interconnects 130-2 and second EIC 114-2 may be electrically coupled to XPU 128 by interconnects 130-1. First and second PICs 104-1, 104-2 also may electrically coupled to each other by EICs 114-1, 114-2, XPU 128, and interconnects 130-1, 130-2. In some embodiments, a microelectronic assembly 100 may include an insulating material 133 that surrounds components (e.g., optical components 182-1, 182-2, PICs 104-1, 104-2, EICs 114-1, 114-2, and XPU 128) on a top surface 170-2 of core 103. The insulating material 133 may include a mold material, such as an organic polymer with inorganic silica particles, or an epoxy material. In some embodiments, the insulating material 133 is a dielectric material. In some embodiments, the dielectric material may include an organic dielectric material, a fire retardant grade 4 material (FR-4), BT resin, polyimide materials, glass reinforced epoxy matrix materials, or low-k and ultra low-k dielectric (e.g., carbon-doped dielectrics, fluorine-doped dielectrics, porous dielectrics, and organic polymeric dielectrics). The insulating material 133 may be formed using any suitable process, including lamination, or slit coating and curing. In some embodiments, the insulating material 133 may be dispensed in liquid form to flow around and conform to various shapes of components and metallization, and, subsequently, may be subjected to a process, for example, curing, that solidifies the insulating material 133. In some embodiments, the insulating material 133 may be initially deposited on and over the top surface of XPU 128, then polished back to expose the top surface of XPU 128. In such embodiments, the insulating material 133 may be removed using any suitable technique, including grinding, or etching, such as a wet etch, a dry etch (e.g., a plasma etch), a wet blast, or a laser ablation (e.g., using excimer laser). In some embodiments, the thickness of the insulating material 133 may be minimized to reduce the etching time required. In some embodiments, the top surface of the insulating material 133 may be planarized using any suitable process, such as chemical mechanical polishing (CMP). In some embodiments, the insulating material 133 may be omitted, for example, as shown in FIG. 1A.

Figure 2B:
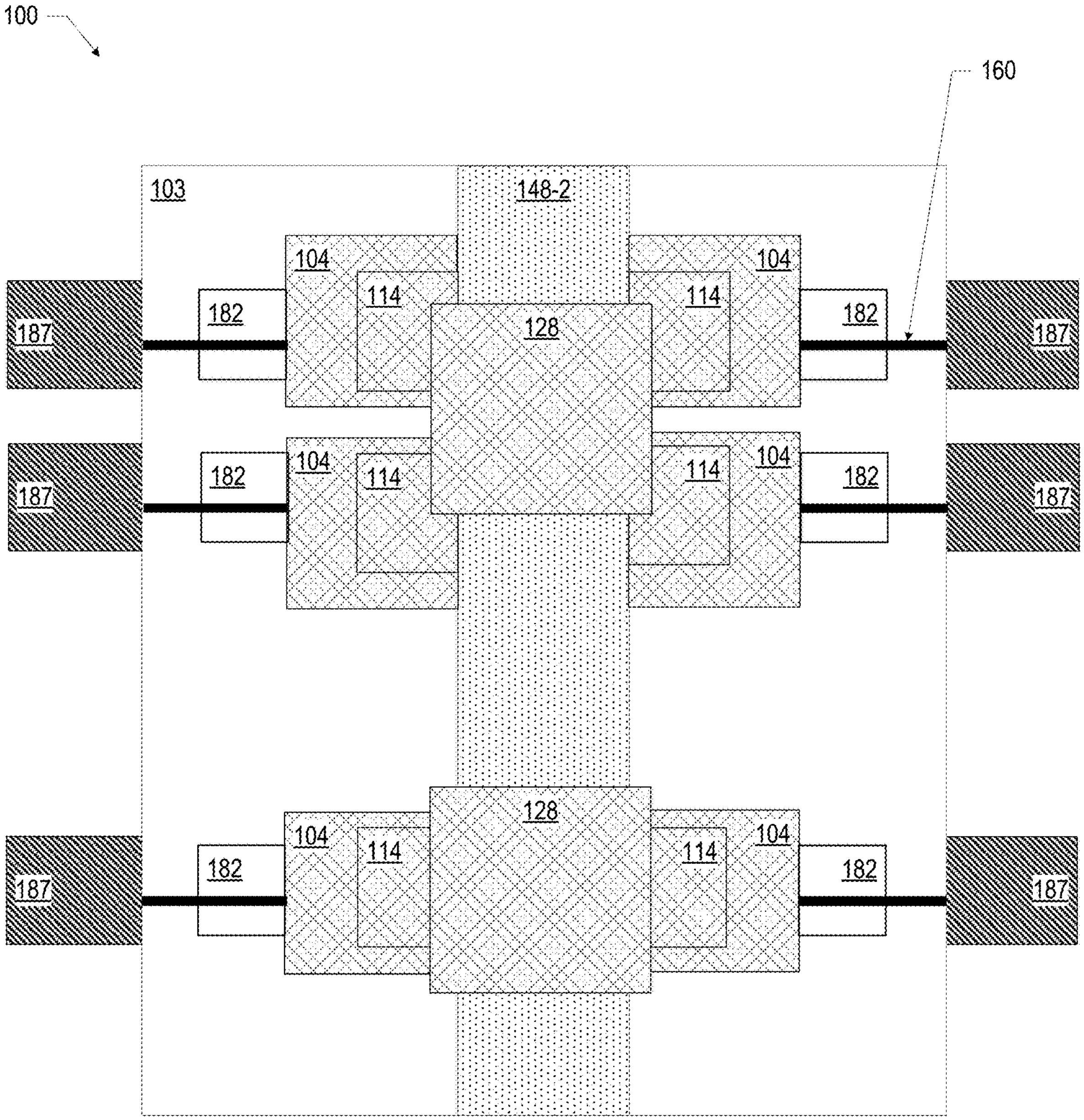
FIG. 2B is a schematic top view of the example microelectronic assembly of FIG. 2A.

FIG. 2B is a top view of the microelectronic assembly of FIG. 2A. As shown in FIG. 2B, the microelectronic assembly 100 may include a plurality of XPUs 128 electrically coupled to an RDL 148-2, a plurality of EICs 114 electrically coupled to PICS 104 and a plurality of optical components 182 optically attached or bonded to PICS 104 and a core 103, and a plurality of fiber connectors 187. As shown in FIG. 2B, individual ones of optical components 182 are coupled to individual ones of PICs 104. Individual ones of PIC 104 may be optically coupled to individual ones of the fiber connectors 187 by optical pathways 160. In some embodiments, one or more EICs 114 may be electrically coupled to XPU 128 by interconnects 130-1, as shown in FIG. 2A and individual PICs 104 may be electrically coupled to individual EICs 114 by interconnects 130-2, as shown in FIG. 2A. Although FIG. 2B shows the microelectronic assembly 100 having two XPUs 128, six EICs 114, six PICs 104, six optical components 182, and six fiber connectors 187, a microelectronic assembly 100 may have any suitable number and arrangement of XPUs 128, EICs 114, PICs 104, optical components 182, and fiber connectors 187, and any suitable number and arrangement electrical and optical connections therebetween.

Figure 3A:
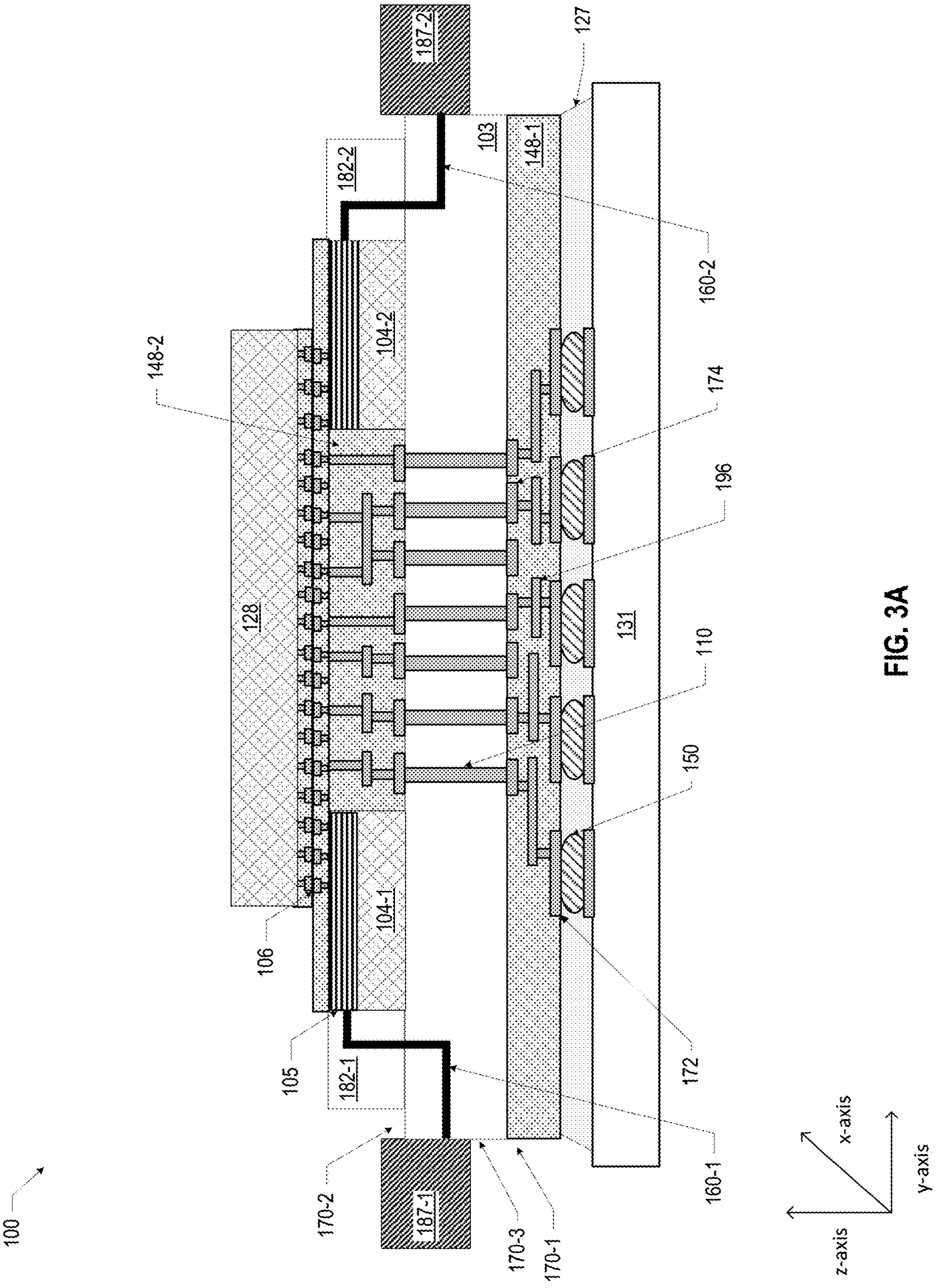
FIG. 3A is a schematic cross-sectional view of another example microelectronic assembly according to some embodiments of the present disclosure.

FIG. 3A is a schematic cross-sectional view of another example microelectronic assembly according to some embodiments of the present disclosure. The configuration of the embodiment shown in the figure is like that of FIG. 1A, except for differences as described further. The configuration of microelectronic assembly 100 as described herein includes XPU 128, first and second PICs 104-1, 104-2, first and second optical components 182-1, 182-2, and first and second fiber connectors 187-1, 187-2, where first PIC 104-1 is optically coupled to the first fiber connector 187-1 by a first optical pathway 160-1 through the first optical component 182-1 and the core 103, and the second PIC 104-2 is optically coupled to the second fiber connector 187-2 by a second optical pathway 160-2 through the second optical component 182-2 and the core 103. First and second PICs 104-1, 104-2 may be electrically coupled to XPU 128 by interconnects 106 with a pitch of less than 10 micrometers between adjacent interconnects 106. In some embodiments, interconnects 106 may have a pitch between 2 microns and 150 microns (for example, between 2 microns and 20 microns, between 20 microns and 75 microns, or between 75 microns and 150 microns). First and second PICs 104-1, 104-2 also may electrically coupled to each other by XPU 128 and interconnects 106.

Figure 3B:
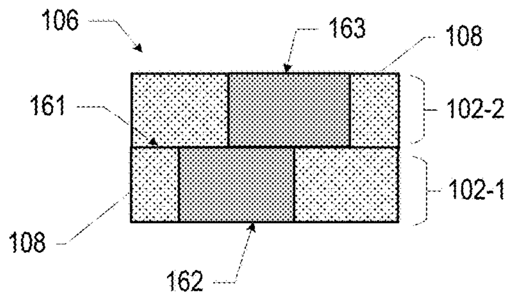
FIG. 3B is a schematic cross-sectional view of a portion of the example microelectronic assembly of FIG. 3A.

FIG. 3B is a schematic cross-sectional view of a detail of a particular one of interconnects 106 in microelectronic assembly 100. Note that although only interconnect 106 is shown, the same structure and description may apply to any other such interconnects comprising hybrid bonds in microelectronic assembly 100 where applicable, for example, a photoimageable dielectric (PID) with copper-to-copper bonding or a liquid metal ink (LMI) interconnect. In a general sense, interconnect 106 may include, at an interface 161 between layers 102-1 and 102-2, metal-metal bonds between bond-pad 162 of layer 102-1 and bond-pad 163 of layer 102-2, and dielectric-dielectric bonds (e.g., oxide-oxide bonds) in a dielectric material 108 of layers 102-1 and 102-2. In some embodiments, the layer 102-2 may be included in XPU 128 and layer 102-1 may be included in PIC 104 and the second RDL 148-2. Bond-pad 162 of layer 102-1 may bond with bond-pad 163 of layer 102-2. Dielectric material 108 in layers 102-1 and 102-2 may bond with each other. A dielectric material 108 may include inorganic materials, for example, silicon and one or more of oxygen, nitrogen, and carbon (e.g., in the form of silicon oxide, silicon nitride, or silicon carbide), and/or other forms of inorganic dielectric material typically used as interlayer dielectric (ILD) in semiconductor devices. The bonded metal and dielectric materials form interconnect 106, comprising hybrid bonds, providing electrical and mechanical coupling between layers 102-1 and 102-2. In various embodiments, interconnects 106 may have a linear dimension of less than 5 micrometers and a pitch of less than 10 micrometers between adjacent interconnects.

Figure 3C:
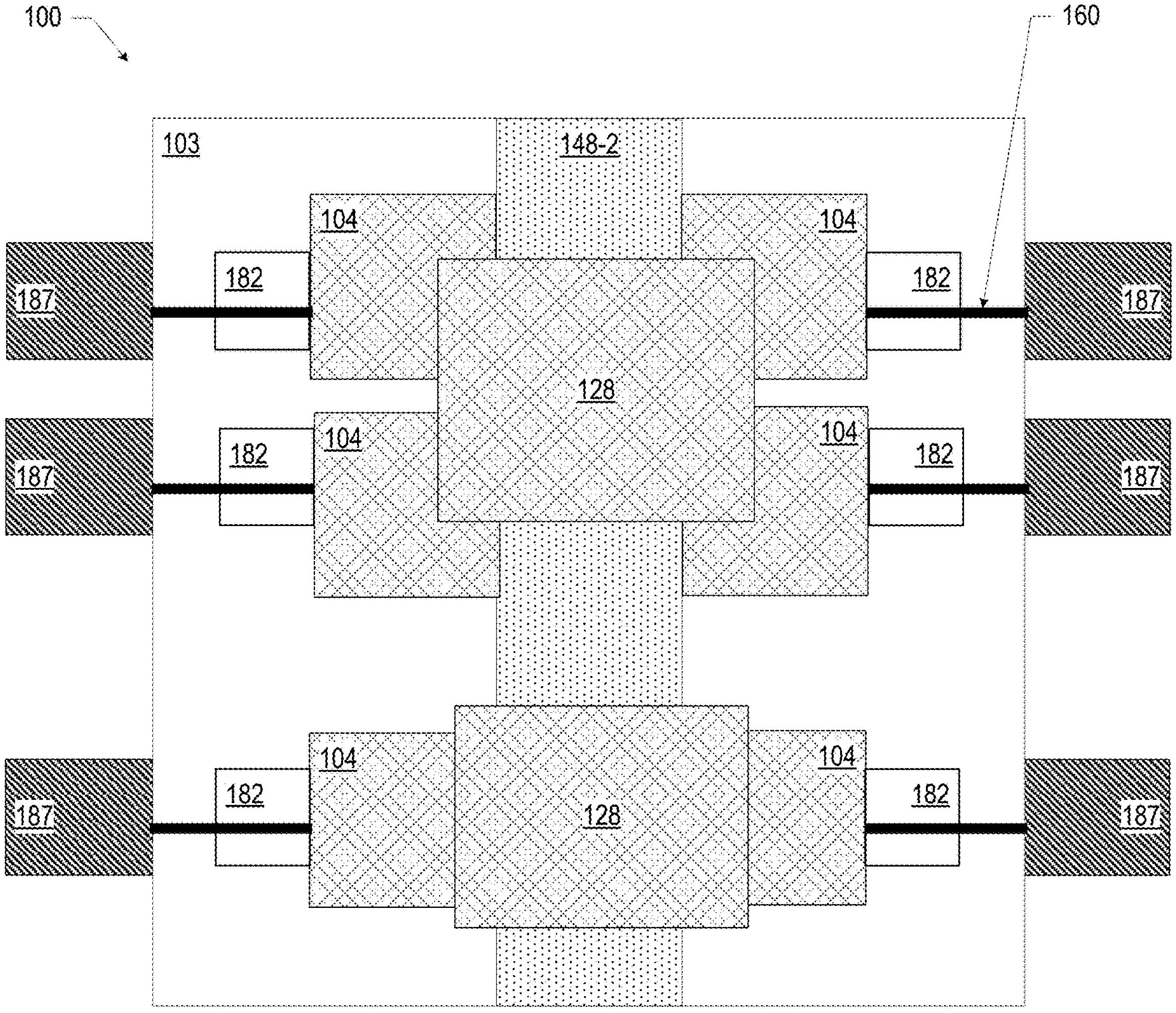
FIG. 3C is a schematic top view of the example microelectronic assembly of FIG. 3A.

FIG. 3C is a top view of the microelectronic assembly of FIG. 3A. As shown in FIG. 3B, the microelectronic assembly 100 may include a plurality of XPUs 128 electrically coupled to an RDL 148-2 and to a plurality of PICs 104, and a plurality of optical components 182 optically coupled to PICS 104 and a core 103, and a plurality of fiber connectors 187. As shown in FIG. 3C, individual ones of optical components 182 are coupled to individual ones of PICs 104. Individual ones of PIC 104 may be optically coupled to individual ones of the fiber connectors 187 by optical pathways 160. In some embodiments, one or more PICs 104 may be electrically coupled to XPU 128 by interconnects 106, as shown in FIG. 3A. Although FIG. 3C shows the microelectronic assembly 100 having two XPUs 128, six PICs 104, six optical components 182, and six fiber connectors 187, a microelectronic assembly 100 may have any suitable number and arrangement of XPUs 128, PICs 104, optical components 182, and fiber connectors 187, and any suitable number and arrangement electrical and optical connections therebetween.

FIG. 4 is a schematic cross-sectional view of another example microelectronic assembly according to some embodiments of the present disclosure. The configuration of the embodiment shown in the figure is like that of FIG. 3A, except for differences as described further. The configuration of microelectronic assembly 100 as described herein includes XPU 128, first and second PICs 104-1, 104-2, and first and second fiber connectors 187-1, 187-2, where first PIC 104-1 is optically coupled to the first fiber connector 187-1 by a first optical pathway 160-1 through the core 103, and the second PIC 104-2 is optically coupled to the second fiber connector 187-2 by a second optical pathway 160-2 through the core 103. First and second PICs 104-1, 104-2 may have an active surface 105 facing towards the second surface 170-2 of the core 103 and optically coupled to respective optical pathways 160-1, 160-2 through the core 103. PICs 104 include optical elements at an active surface 105 that allow PIC 104 to transmit and/or receive light through the active surface 105 (e.g., vertical transmission and reception of light), as described above with reference to FIG. 1A. First and second PICs 104-1, 104-2 may include through silicon vias (TSVs) 115 and may be electrically coupled to XPU 128 by interconnects 106 with a pitch of less than 10 micrometers between adjacent interconnects 106. First and second PICs 104-1, 104-2 also may electrically coupled to each other by XPU 128 and interconnects 106. Further, as shown in FIG. 4, a microelectronic assembly 100 may include PICs 104-1, 104-2 nested in a cavity in a dielectric material of the second RDL 148-2 (e.g., surrounded by a dielectric material of the second RDL 148-2). A dielectric material 108 of interconnects 106, as shown in FIG. 3B, may extend along an entire top surface of the second RDL 148-2 (e.g., on a top surface of PICs 104-1, 104-2). In some embodiments, a dielectric material 108 of interconnects 106 may extend along a portion of the top surface of the second RDL 148-2.

Figure 5A:
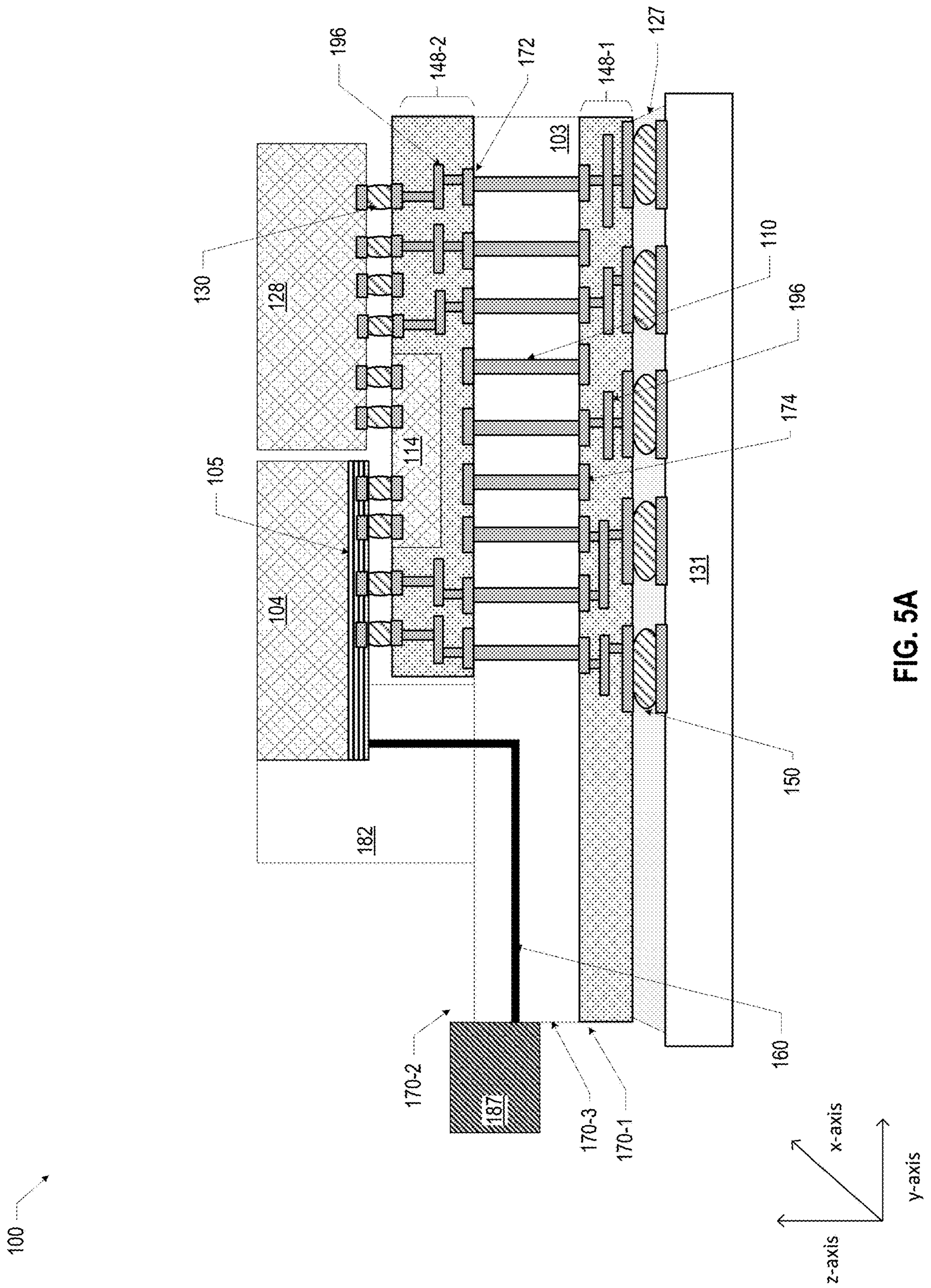
FIGS. 5A and 5B are schematic cross-sectional views of other example microelectronic assemblies according to some embodiments of the present disclosure.

FIG. 5A is a schematic cross-sectional view of another example microelectronic assembly according to some embodiments of the present disclosure. The configuration of the embodiment shown in the figure is like that of FIG. 1A, except for differences as described further. The configuration of microelectronic assembly 100 as described herein includes PIC 104, an optical component 182, and a fiber connector 187, where PIC 104 is optically coupled to the fiber connector 187 by an optical pathway 160 through the optical component 182 and the core 103. PICs 104 include optical elements at an active surface 105 that allow PIC 104 to transmit and/or receive light through the active surface 105 (e.g., vertical transmission and reception of light), as described above with reference to FIG. 1A. EIC 114 may be at least partially nested in a cavity in a dielectric material of the second RDL 148-2 (e.g., partially surrounded by or embedded in a dielectric material of the second RDL 148-2). PIC 104 and XPU 128 may be electrically coupled to EIC 114 and the second RDL 148-2 by interconnects 130. PIC 104 and XPU 128 may be electrically coupled by EIC 114 and interconnects 130. The optical component 182 may include any suitable optical component, as described above with reference to optical component 182 of FIG. 1A. The optical component 182 may be optically coupled to PIC 104 and tested to verify functionality prior to assembly of the microelectronic assembly 100.

Figure 5B:
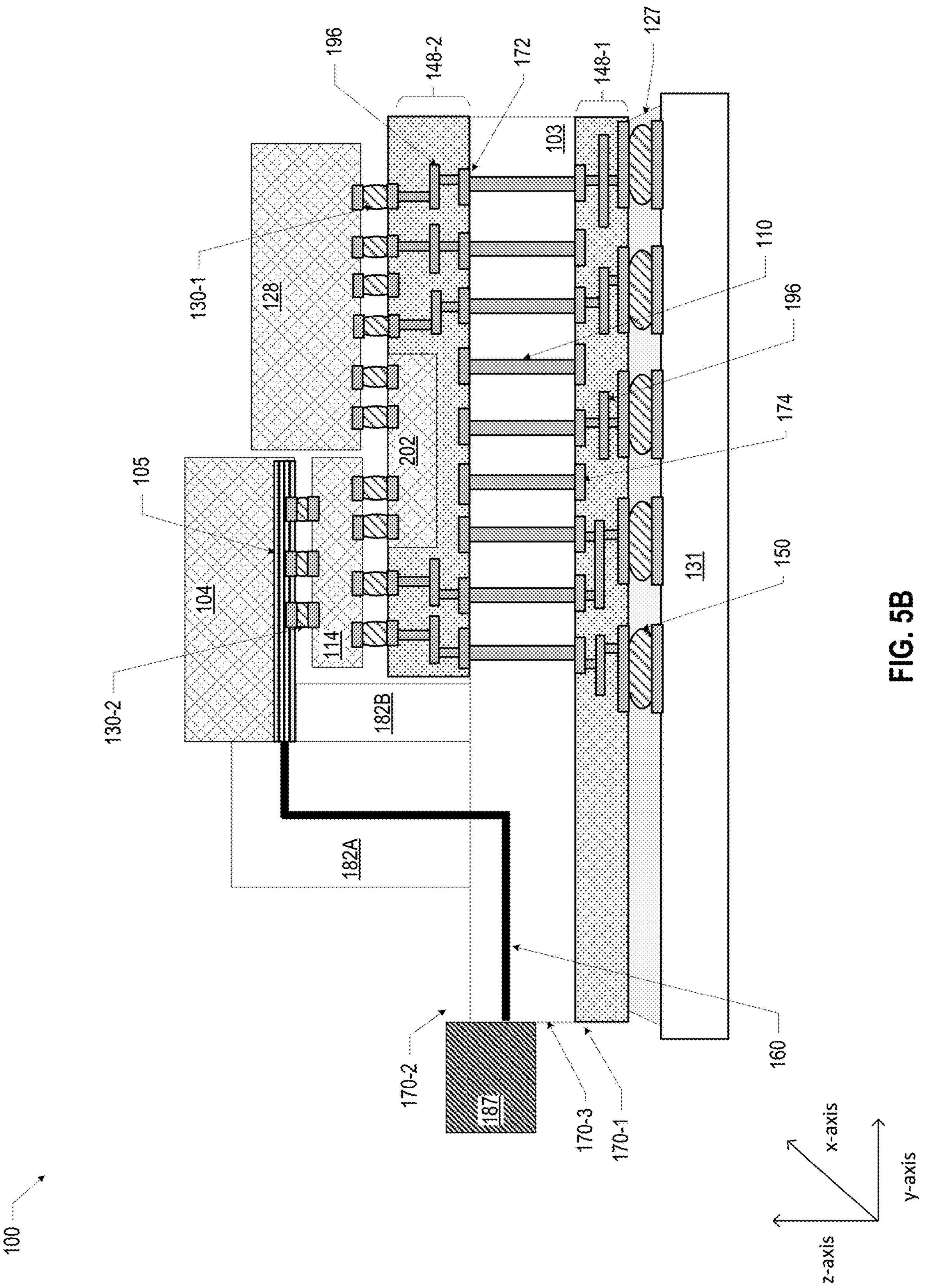

FIG. 5B is a schematic cross-sectional view of another example microelectronic assembly according to some embodiments of the present disclosure. The configuration of the embodiment shown in the figure is like that of FIG. 5A, except for differences as described further. The configuration of microelectronic assembly 100 as described herein includes PIC 104, optical component 182 (e.g., including a first portion 182A coupled to a second portion 182B) and a fiber connector 187, where PIC 104 is optically coupled to the fiber connector 187 by an optical pathway 160 through the first portion 182A of the second optical component 182 and the core 103. In some embodiments, an optical pathway 160 may be through the second portion 182B (not shown) of the second optical component 182 such that the first and second portions 182A, 182B are optically coupled. A microelectronic assembly 100 may further include a bridge die 202 at least partially nested in a cavity in a dielectric material of the second RDL 148-2 (e.g., partially surrounded by or embedded in a dielectric material of the second RDL 148-2). PIC 104 may be electrically coupled to EIC 114 by interconnects 130-2, and EIC 114 and XPU 128 may be electrically coupled to bridge die 202 and the second RDL 148-2 by interconnects 130-1. PIC 104 and XPU 128 may be electrically coupled by EIC 114, bridge die 202, and interconnects 130-1, 130-2. The optical component 182 may include any suitable optical component, as described above with reference to optical component 182 of FIG. 1A. The second portion of the second optical component 182B may include a support material that may provide mechanical support and structural stability to PIC 104, for example, silicon dioxide, glass, epoxy and/or resins. The optical component 182 may be optically coupled to PIC 104 and tested to verify functionality prior to assembly of the microelectronic assembly 100.

Figure 6A:
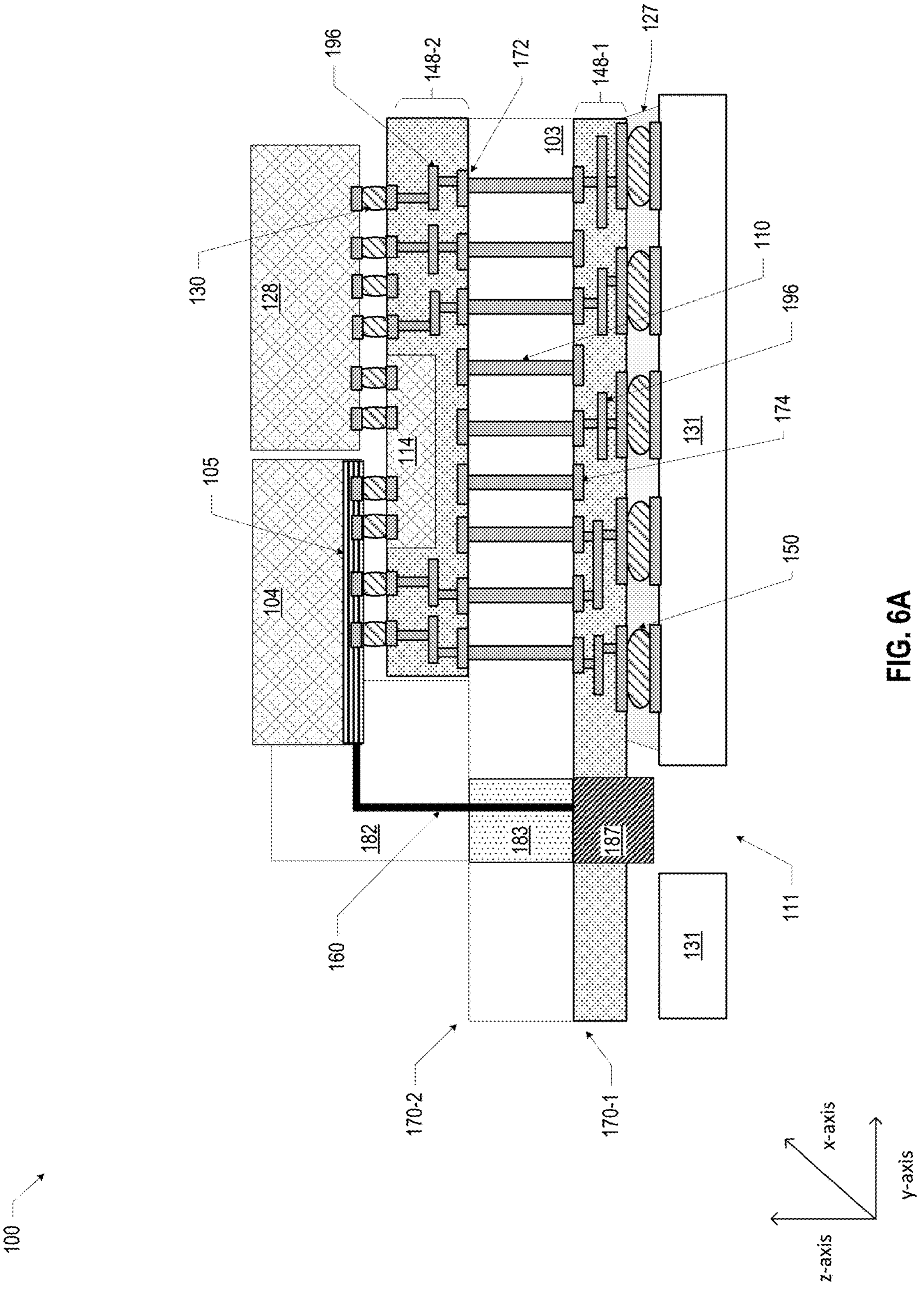
FIGS. 6A and 6B are schematic cross-sectional views of other example microelectronic assemblies according to some embodiments of the present disclosure.

FIG. 6A is a schematic cross-sectional view of another example microelectronic assembly according to some embodiments of the present disclosure. The configuration of the embodiment shown in the figure is like that of FIG. 5A, except for differences as described further. The configuration of microelectronic assembly 100 as described herein includes PIC 104, optical component 182, a GRIN lens 183, and a fiber connector 187, where PIC 104 is optically coupled to the fiber connector 187 by an optical pathway 160 through the optical component 182, and the GRIN lens 183 in the core 103. EIC 114 may be at least partially nested in a cavity in a dielectric material of the second RDL 148-2 (e.g., partially surrounded by or embedded in a dielectric material of the second RDL 148-2). PIC 104 and XPU 128 may be electrically coupled to EIC 114 and the second RDL 148-2 by interconnects 130. PIC 104 and XPU 128 may be electrically coupled by EIC 114 and interconnects 130. The optical component 182 may include any suitable optical component, as described above with reference to optical component 182 of FIG. 1A. The optical component 182 may be optically coupled to PIC 104 and tested to verify functionality prior to assembly of the microelectronic assembly 100. GRIN lens 183 may be embedded in a cavity in the core 103 during substrate manufacturing. Circuit board 131 may include an aperture 111 for optically coupling an optical signal from the fiber connector 187 to an external source.

Figure 6B:
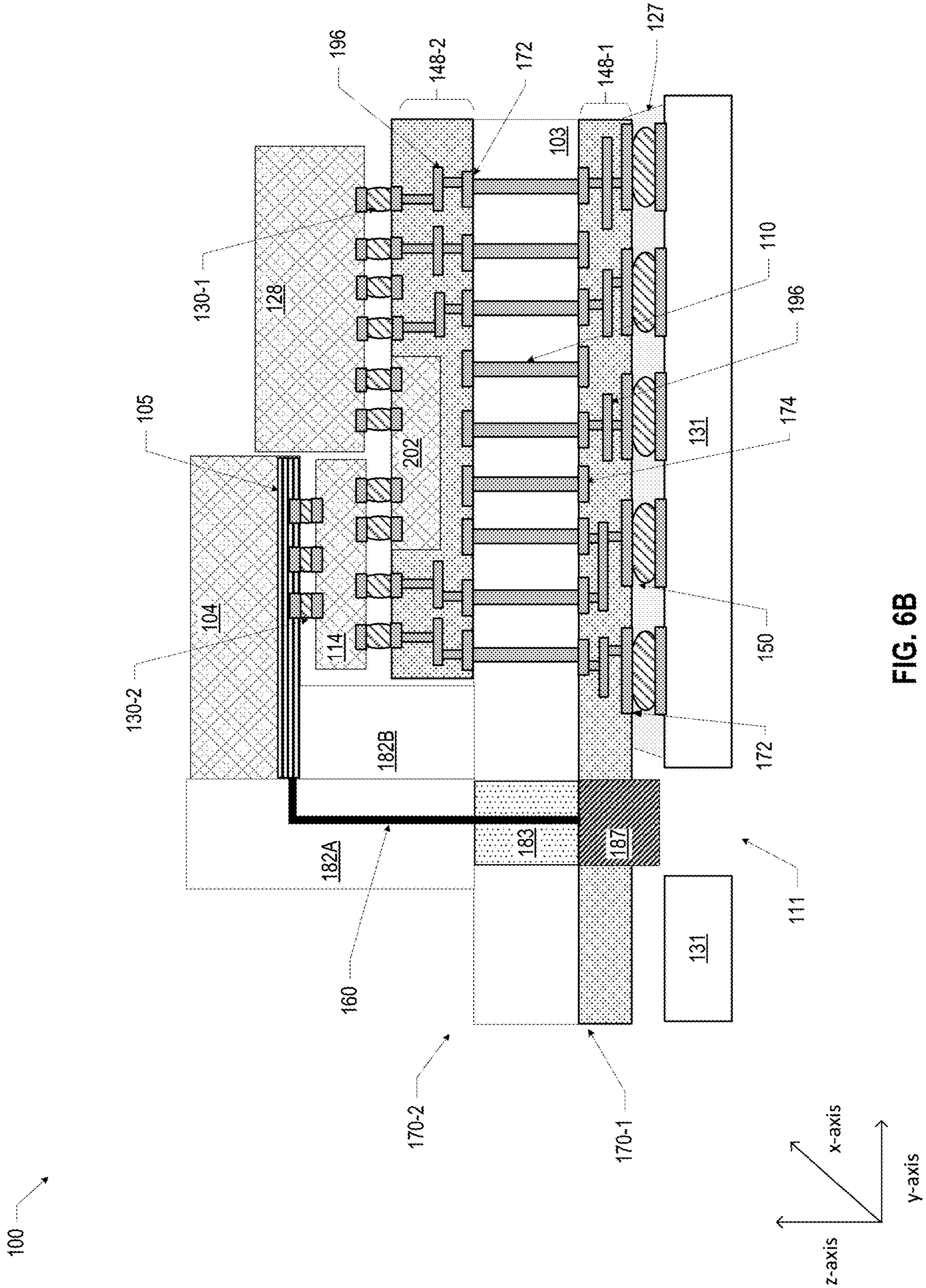

FIG. 6B is a schematic cross-sectional view of another example microelectronic assembly according to some embodiments of the present disclosure. The configuration of the embodiment shown in the figure is like that of FIG. 6A, except for differences as described further. The configuration of microelectronic assembly 100 as described herein includes PIC 104, optical component 182 (e.g., including a first portion 182A coupled to a second portion 182B), a GRIN lens 183, and a fiber connector 187, where PIC 104 is optically coupled to the fiber connector 187 by an optical pathway 160 through the first portion 182A of the optical component 182, and the GRIN lens 183 in the core 103. A microelectronic assembly 100 may further include a bridge die 202 at least partially nested in a cavity in a dielectric material of the second RDL 148-2 (e.g., partially surrounded by or embedded in a dielectric material of the second RDL 148-2). PIC 104 may be electrically coupled to EIC 114 by interconnects 130-2, and EIC 114 and XPU 128 may be electrically coupled to bridge die 202 and the second RDL 148-2 by interconnects 130-1. PIC 104 and XPU 128 may be electrically coupled by EIC 114, bridge die 202, and interconnects 130-1, 130-2. The optical component 182 may include any suitable optical component, as described above with reference to optical component 182 of FIG. 1A. The second portion of the second optical component 182B may include a support material that may provide mechanical support and structural stability to PIC 104, for example, silicon dioxide, glass, epoxy and/or resins. In other embodiments, an optical pathway 160 may be through the second portion 182B (not shown) of the second optical component 182 such that the first and second portions 182A, 182B are optically coupled. The optical components 182 may be optically coupled to PIC 104 and tested to verify functionality prior to assembly of the microelectronic assembly 100. GRIN lens 183 may be embedded in a cavity in the core 103 during substrate manufacturing. Circuit board 131 may include an aperture 111 for optically coupling an optical signal from the fiber connector 187 to an external source.

Figure 7:
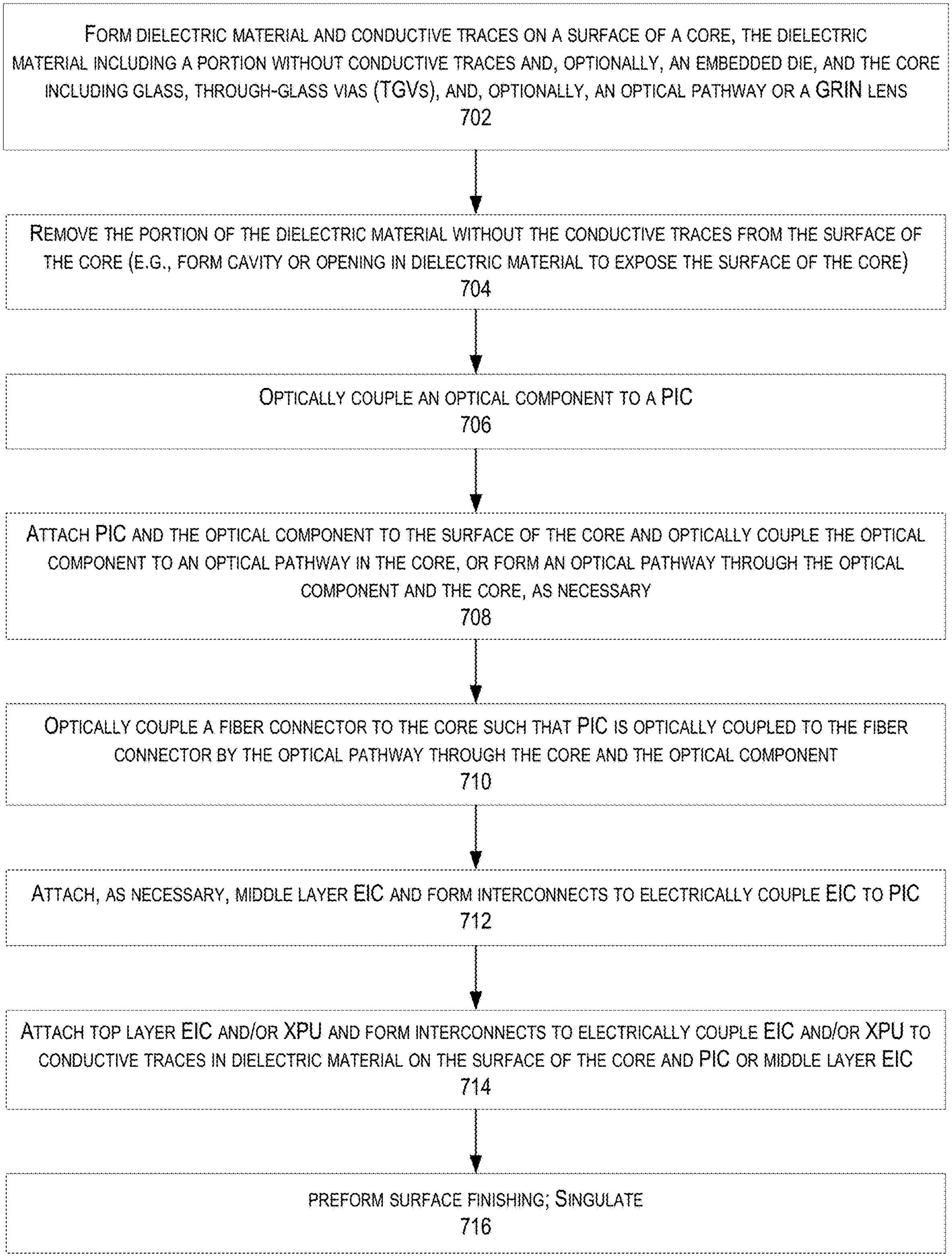
FIG. 7 is a schematic flow diagram listing example operations that may be associated with fabricating a microelectronic assembly according to some embodiments of the present disclosure.

Any suitable techniques may be used to manufacture the microelectronic assemblies 100 disclosed herein. FIG. 7 is a flow diagram of an example method of fabricating an example microelectronic assembly, in accordance with various embodiments. At 702, a dielectric material including conductive pathways 196 (e.g., an RDL 148) may be formed on a surface 170-2 of a core 103. In some embodiments, the core 103 may include glass. In some embodiments, the core 103 may include at least a portion of an optical pathway 160 and/or a GRIN lens 183. The RDL 148 may include a portion of dielectric material without conductive pathways 196. The RDL 148 may be manufactured using any suitable technique, such as a PCB technique or a redistribution layer technique. At 704, the portion of dielectric material without conductive traces may be removed to form a cavity or opening and to expose the surface 170-2 of the core 103. The dielectric material may be removed using any suitable process, including grinding. At 706, an optical component 182 may be coupled to an active surface 105 of a PIC 104. Optical component 182 may be optically aligned to PIC 104, as necessary, and may be physically attached using any suitable technique, including optical glue or fusion bonding. In some embodiments, optical component 182 may be optically attached to PIC 104 subsequent to PIC 104 being attached to the surface 170-2 of the core 103. The optical bonding surfaces may be further subjected to grinding and polishing to form an optically smooth surface. At 708, PIC 104 and optical component 182 may be attached to the surface 170-2 of the core 103 and optically aligned with the optical pathway 160 through the core 103. PIC 104 may be attached with the active surface 105 facing away from the surface 170-2 of the core 103, as shown in FIGS. 1A, 2A, and 3A, or may be attached with the active surface 105 facing towards the surface 170-2 of the core 103, as shown in FIGS. 4, 5A, and 5B. Optical component 182 and PIC 104, if the active surface 105 of PIC 104 is facing towards the surface 170-2 of the core 103, may be optically aligned to the optical pathway 160 in the core 103, as necessary, and physically attached using any suitable technique, including optical glue or fusion bonding. If the active surface of PIC 104 is facing away from the surface 170-2 of the core 103, PIC 104 may be attached to the core 103 using suitable technique, including a non-conductive adhesive, die attach film (DAF), a B-stage underfill, or a polymer film with adhesive property. In some embodiments, an optical pathway 160 may be formed in situ through the core 103 and through optical component 182 (e.g., a laser written waveguide). Any suitable method may be used to place PIC 104, for example, automated pick-and-place. At 710, a fiber connector (e.g., fiber connector 187 of FIG. 1A) may be optically coupled to the core 103 such that the fiber connector 187 is optically coupled to PIC 104 by optical pathway 160 through the core 103 and the optical component 182. The fiber connector 187 may be optically aligned, as necessary, and may be physically attached using any suitable technique, including a plug, a socket, optical glue or fusion bonding. At 712, middle layer dies, such as EIC 114 as shown in FIG. 2A, may be electrically coupled to PIC 104 by forming interconnects (e.g., interconnects 130-2 or interconnects 106). To form interconnects 130 (e.g., interconnects 130-2, as shown in FIG. 2A), the assembly may be subjected to a solder reflow process during which solder 132 of the interconnects 130 melt and bond to mechanically and electrically couple EIC 114 to PIC 104. At 714, top layer dies, such as XPU 128 and/or EIC 114 as shown in FIGS. 1A, 2A, 3A, and 4, may be electrically coupled to the conductive traces 196 in the dielectric material on the surface 170-2 of the core 103 and PIC 104 or middle layer EIC 114 by forming interconnects (e.g., interconnects 130 or interconnects 106). To form interconnects 106, XPU 128 and EIC 114 may include a bonding layer at a bottom surface having bond-pads 163 in dielectric material 108 and PIC 104 and RDL 148-2 may include a top surface having bond-pads 162 in dielectric material 108 (e.g., as shown in FIG. 3B). The bond-pads 162 of PIC 104 and RDL 148-2 may correspond to the bond-pads 163 of XPU 128 and EIC 114 for forming hybrid direct bonds (e.g., interconnects 106). Any suitable method may be used to place XPU 128 and PICs 104, for example, automated pick-and-place. The assembly may be subjected to appropriate bonding processing to form interconnects 106. For example, the bonding process may include applying a suitable pressure and heating to a suitable temperature (e.g., to moderately high temperatures, e.g., between about 50 and 200 degrees Celsius) for a duration of time. At 716, surface finishing operations may be performed and assemblies may be singulated, as necessary. Surface finishing operations may include, for example, dispensing an underfill material 127, dispensing solder resist, and attaching solder balls 136. Further manufacturing operations may be performed, for example, the solder 136 may be electrically coupled to a circuit board 131 to form interconnects 150, similar to the microelectronic assembly 100 of FIGS. 1, 2, 3, 4, and 5.

Figure 8:
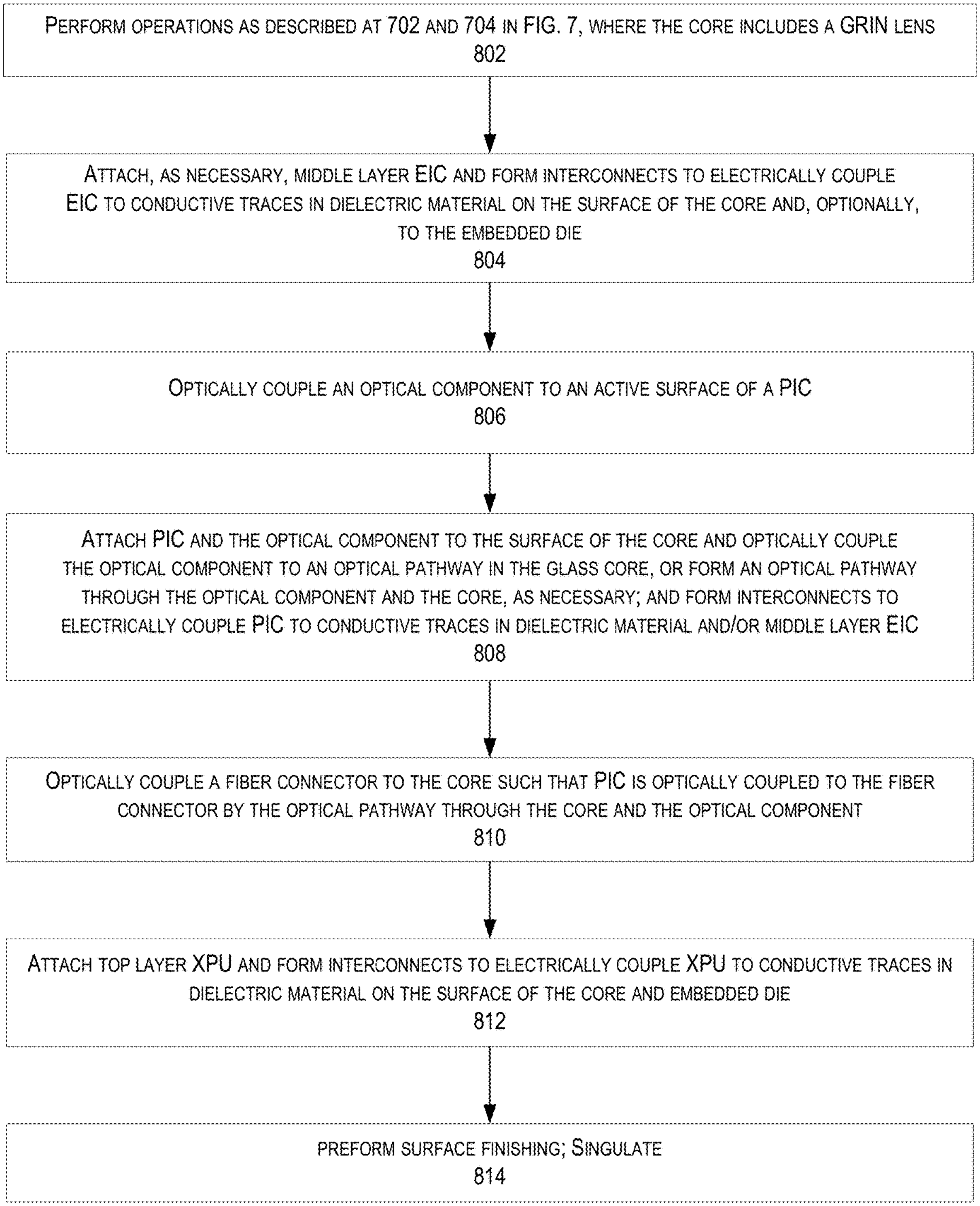
FIG. 8 is a schematic flow diagram listing example operations that may be associated with fabricating a microelectronic assembly according to some embodiments of the present disclosure.

FIG. 8 is a flow diagram of an example method of fabricating an example microelectronic assembly, in accordance with various embodiments. At 802, operations as described in FIG. 7 at 702 and 704 may be performed, including forming a dielectric material including conductive pathways 196 on a surface 170-2 of a core 103, where the core 103 includes a GRIN lens 183, and removing a portion of dielectric material to expose the surface 170-2 of the core 103. At 804, middle layer dies, such as EIC 114 as shown in FIGS. 5B and 6B, may be electrically coupled to PIC 104 by forming interconnects (e.g., interconnects 130 or interconnects 106). At 806, an optical component 182 may be optically coupled to an active surface 105 of a PIC 104. The optical component 182 may be physically attached using any suitable technique, including optical glue or fusion bonding. At 808, PIC 104 with the optical component 182 may be attached to the surface 170-2 of the core 103 and optically aligned with the optical pathway 160 through the GRIN lens 183 in the core 103. PIC 104 may be attached with the active surface 105 facing towards the surface 170-2 of the core 103, as shown in FIGS. 6A and 6B. The optical component 182 may be optically aligned to the optical pathway 160 in the core 103, as necessary, and physically attached using any suitable technique, including optical glue or fusion bonding. PIC 104 may be electrically coupled to conductive pathways 196 in the dielectric material (e.g., RDL 148-2) and/or the middle layer EIC 114 by interconnects (e.g., interconnects 130 or interconnects 106). At 810, a fiber connector (e.g., fiber connector 187 of FIGS. 6A and 6B) may be optically coupled to the GRIN lens 183 in the core 103 such that the fiber connector 187 is optically coupled to PIC 104 by optical pathway 160 through the GRIN lens 183 and the optical component 182. The fiber connector 187 may be optically aligned, as necessary, and may be physically attached using any suitable technique, including a plug, a socket, optical glue or fusion bonding. At 812, top layer dies, such as XPU 128, as shown in FIGS. 5 and 6, may be electrically coupled to the conductive traces 196 in the dielectric material on the surface 170-2 of the core 103 (e.g., RDL 148-2) and the embedded die (e.g., bridge die 202 or EIC 114, as shown in FIGS. 5 and 6) by forming interconnects (e.g., interconnects 130 or interconnects 106). At 814, surface finishing operations may be performed and assemblies may be singulated, as necessary. Surface finishing operations may include, for example, dispensing an underfill material 127, dispensing solder resist, and attaching solder balls 136. Further manufacturing operations may be performed, for example, the solder 136 may be electrically coupled to a circuit board 131 to form interconnects 150, similar to the microelectronic assembly 100 of FIG. 6.

Figure 9:
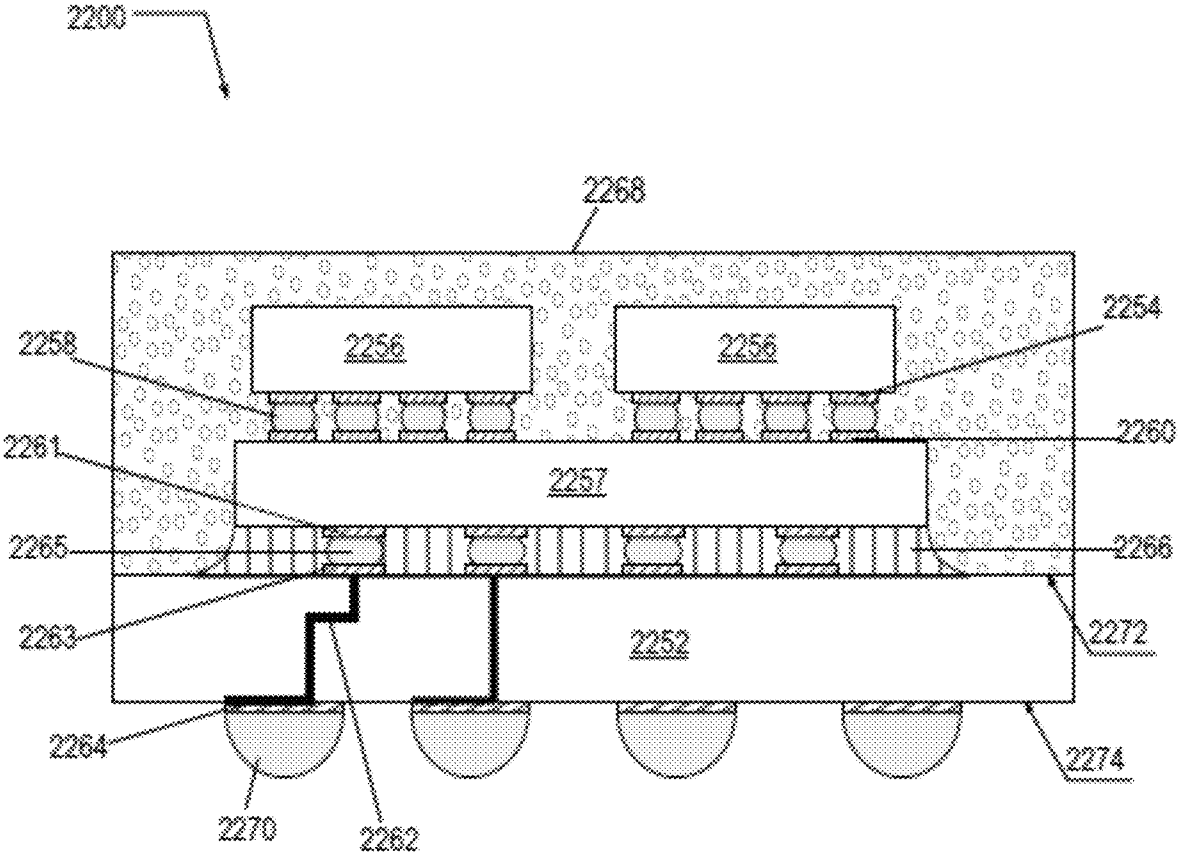
FIG. 9 is a cross-sectional view of a device package that includes one or more microelectronic assemblies in accordance with any of the embodiments disclosed herein.
Figure 10:
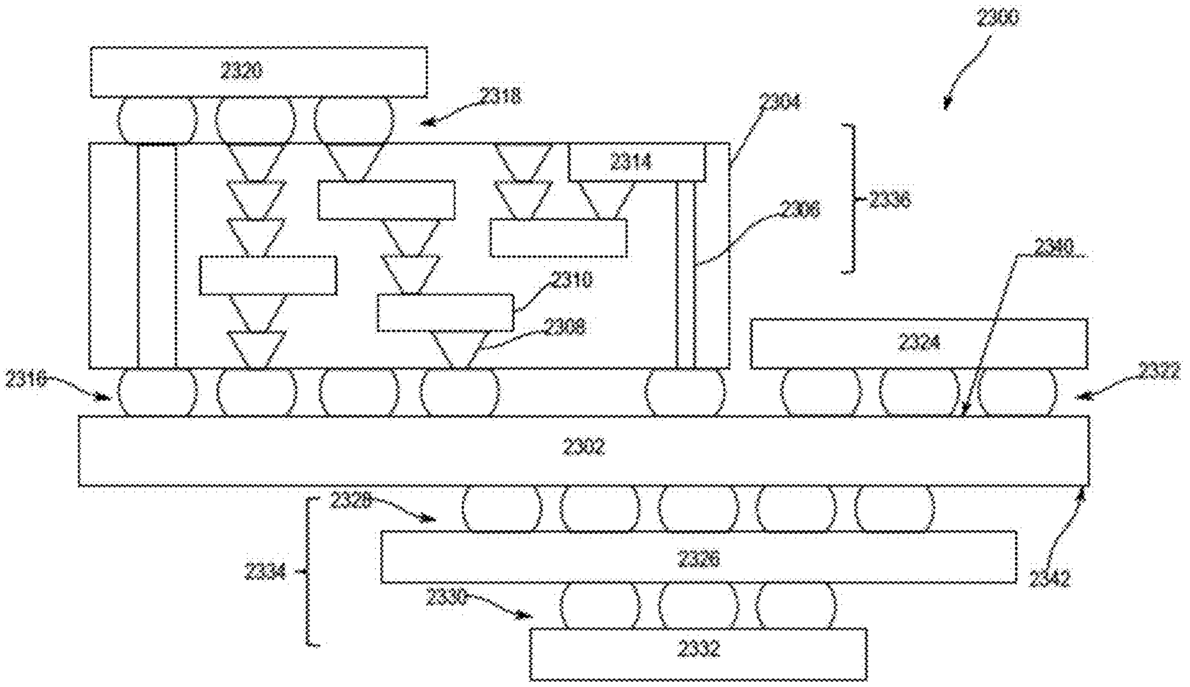
FIG. 10 is a cross-sectional side view of a device assembly that includes one or more microelectronic assemblies in accordance with any of the embodiments disclosed herein.
Figure 11:
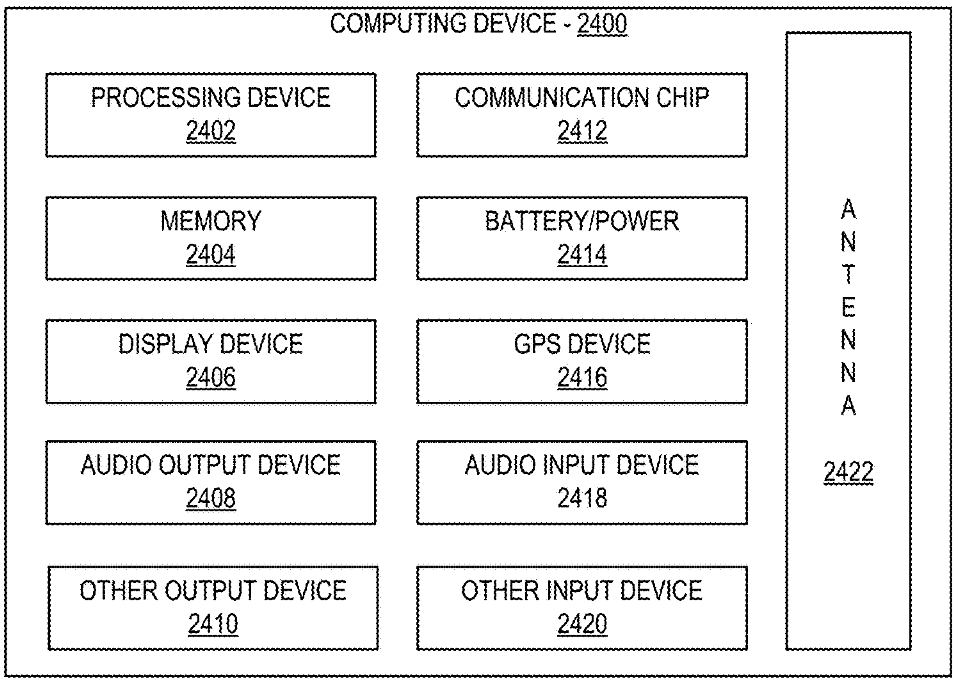
FIG. 11 is a block diagram of an example computing device that includes one or more microelectronic assemblies in accordance with any of the embodiments disclosed herein.

The packages disclosed herein, e.g., any of the microelectronic assemblies 100 or any further embodiments described herein, may be included in any suitable electronic component. FIGS. 9-11 illustrate various examples of packages, assemblies, and devices that may be used with or include any of the IC packages as disclosed herein.

FIG. 9 is a side, cross-sectional view of an example IC package 2200 that may include IC packages in accordance with any of the embodiments disclosed herein. In some embodiments, the IC package 2200 may be a SiP.

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 10.

In various embodiments, any of dies 2256 may be microelectronic assembly 100, as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., HBM), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 10 is a cross-sectional side view of an IC device assembly 2300 that may include components having one or more microelectronic assembly 100, in accordance with any of the embodiments disclosed herein. IC device assembly

2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100, in accordance with any of the embodiments disclosed herein; e.g., any of the IC packages discussed below with reference to IC device assembly 2300 may take the form of any of the embodiments of IC package 2200 discussed above with reference to FIG. 9.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 9. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. More complex devices such as radio frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 11 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 9). In yet another example, any one or more of the components of computing device 2400 may include an IC device assembly 2300 (e.g., as shown in FIG. 10).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single SoC die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more DSPs, ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-MRAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

Example 1A is a photonic assembly, including a substrate, including a core having a surface, wherein a material of the core includes glass; and a dielectric material on a portion of the surface of the core, the dielectric material including conductive pathways; a photonic integrated circuit (PIC) having an active surface, wherein the PIC is coupled to the surface of the core with the active surface of the PIC facing away from the surface of the core; a processor integrated circuit (XPU) electrically coupled to the conductive pathways in the dielectric material and to the active surface of the PIC; a first optical component optically coupled to a lateral surface of the PIC and to the surface of the core; and a second optical component coupled to the core, wherein the second optical component is optically coupled to the PIC by an optical pathway through the first optical component and the core.

Example 2A may include the subject matter of Example 1A, and may further specify that the first optical component includes a glass block, a glass block with a reflector, a glass block with a curved surface, a glass block with a mirror reflector, a glass block with a multi-directional reflector, a glass block with a waveguide, a glass block with a laser written waveguide, an optical lens, a micro-lens, or a gradient-index (GRIN) lens.

Example 3A may include the subject matter of Examples 1A or 2A, and may further specify that the second optical component is a fiber connector.

Example 4A may include the subject matter of any of Examples 1A-3A, and may further specify that the PIC is coupled to the surface of the core by a die attach film (DAF), a non-conductive adhesive, a B-stage underfill, or a polymer film with adhesive property.

Example 5A may include the subject matter of any of Examples 1A-4A, and may further specify that the optical pathway includes a waveguide.

Example 6A may include the subject matter of Example 5A, and may further specify that the waveguide is a laser written waveguide.

Example 7A may include the subject matter of any of Examples 1A-6A, and may further specify that the first optical component is coupled to the PIC by optical glue or by fusion bonding.

Example 8A may include the subject matter of any of Examples 1A-7A, and may further specify that the optical pathway is a first optical pathway, the PIC is a first PIC having a first active surface, and the photonic assembly may further include a second PIC having a second active surface, wherein the second PIC is coupled to the surface of the core with the second active surface of the second PIC facing away from the surface of the core, and the XPU is electrically coupled to the second active surface of the second PIC; a third optical component optically coupled to a lateral surface of the second PIC and to the surface of the core; and a fourth optical component coupled to the core, wherein the fourth optical component is optically coupled to the second PIC by an optical pathway through the third optical component and the core.

Example 9A may include the subject matter of any of Examples 1A-8A, and may further include an electrical integrated circuit (EIC) electrically coupled to the conductive pathways in the dielectric material.

Example 10A may include the subject matter of Example 9A, and may further include an interconnect die embedded in the dielectric material and electrically coupled to the XPU and the EIC.

Example 11A may include the subject matter of any of Examples 1A-8A, and may further include an electrical integrated circuit (EIC) between the PIC and the XPU and electrically coupled to the PIC and the XPU.

Example 12A may include the subject matter of any of Examples 1A-11A, and may further specify that the surface of the core is a second surface, the core further includes a first surface opposite the second surface, the dielectric material is a second dielectric material including second conductive pathways, and the photonic assembly may further include a first dielectric material on the first surface of the core, the first dielectric material including first conductive pathways; and a circuit board electrically coupled to the first conductive pathways.

Example 13A may include the subject matter of any of Examples 1A-7A, and may further specify that the PIC is one of a plurality of PICs, the first optical component is one of a plurality of first optical components, the second optical component is one of a plurality of second optical components, and the optical pathway is one of a plurality of optical pathways.

Example 14A may include the subject matter of any of Examples 1A-12A, and may further specify that the second optical component is coupled by a plug or a socket.

Example 15A is a photonic assembly, including a substrate, including a core having a surface, wherein a material of the core includes glass; a dielectric material with conductive traces on a portion of the surface of the core; a photonic integrated circuit (PIC) having an active surface and an opposing second surface, wherein the PIC is optically coupled to the surface of the core with the active surface of the PIC facing towards the surface of the core; a processor integrated circuit (XPU) electrically coupled to the conductive traces in the dielectric material and to the second surface of the PIC; and an optical component coupled to the core, wherein the optical component is optically coupled to the PIC by an optical pathway through the core.

Example 16A may include the subject matter of Example 15A, and may further specify that the core includes a waveguide.

Example 17A may include the subject matter of Example 16A, and may further specify that the waveguide is a laser written waveguide.

Example 18A may include the subject matter of any of Examples 15A-17A, and may further specify that the core includes a reflector.

Example 19A may include the subject matter of any of Examples 15A-18A, and may further specify that the optical component is a fiber connector.

Example 20A may include the subject matter of any of Examples 15A-19A, and may further specify that the PIC includes through-substrate vias (TSVs).

Example 21A may include the subject matter of any of Examples 15A-20A, and may further specify that the PIC is one of a plurality of PICs, the optical component is one of a plurality of optical components, and the optical pathway is one of a plurality of optical pathways.

Example 23A is a photonic assembly, including a substrate, including a core having a surface, wherein a material of the core includes glass; and a dielectric material on a portion of the surface of the core, the dielectric material including conductive pathways; a plurality of photonic integrated circuits (PICs) having active surfaces, wherein the plurality of PICs are coupled to the surface of the core with the active surfaces facing away from the surface of the core; a processor integrated circuit (XPU) electrically coupled to the conductive pathways in the dielectric material and to the active surfaces of the plurality of PICs; a plurality of first optical components, individual ones of the plurality of first optical components optically coupled to lateral surfaces of individual ones of the plurality of PICs and to the surface of the core; and a plurality of second optical components coupled to the core, wherein individual ones of the plurality of second optical components are optically coupled to individual ones of the plurality of PICs by optical pathways through individual ones of the plurality of first optical components and the core.

Example 24 may include the subject matter of Example 23, and may further specify that the plurality of first optical components includes one or more of a glass block, a glass block with a reflector, a glass block with a curved surface, a glass block with a mirror reflector, a glass block with a multi-directional reflector, a glass block with a waveguide, a glass block with a laser written waveguide, an optical lens, a micro-lens, or a gradient-index (GRIN) lens.

Example 25A may include the subject matter of Examples 23A or 24A, and may further specify that the plurality of second optical components includes a fiber connector.

Example 26A may include the subject matter of any of Examples 23A-25A, and may further specify that the plurality of PICs are coupled to the plurality of first optical components by optical glue or by fusion bonding.

Example 27A may include the subject matter of any of Examples 23A-26A, and may further include a plurality of electrical integrated circuits (EICs) between individual ones of the plurality of PICS and the XPU, wherein individual ones of the plurality of EICs are electrically coupled to individual ones of the plurality of PICS and the XPU.

Example 1B is a photonic assembly, including a substrate, including a core having a surface, wherein a material of the core includes glass; and a dielectric material on a portion of the surface of the core, the dielectric material including conductive pathways and an interconnect die; a photonic integrated circuit (PIC) having an active surface facing towards the surface of the core, wherein the PIC is electrically coupled to the interconnect die and to the conductive pathways in the dielectric material at the surface of the core; a processor integrated circuit (XPU) electrically coupled to the interconnect die and to the conductive pathways in the dielectric material at the surface of the core; a first optical component optically coupled to the active surface of the PIC and to the surface of the core; and a second optical component coupled to the core, wherein the second optical component is optically coupled to the PIC by an optical pathway through the first optical component and the core.

Example 2B may include the subject matter of Example 1B, and may further specify that the first optical component includes a glass block, a glass block with a reflector, a glass block with a curved surface, a glass block with a mirror reflector, a glass block with a multi-directional reflector, a glass block with a waveguide, a glass block with a laser written waveguide, an optical lens, a micro-lens, or a gradient-index (GRIN) lens.

Example 3B may include the subject matter of Examples 1B or 2B, and may further specify that the second optical component is a fiber connector.

Example 4B may include the subject matter of any of Examples 1B-3B, and may further specify that the first optical component is coupled to the active surface of the PIC by an optical glue or by fusion bonding.

Example 5B may include the subject matter of any of Examples 1B-4B, and may further specify that the optical pathway includes a waveguide.

Example 6B may include the subject matter of Example 5B, and may further specify that the waveguide is a laser written waveguide.

Example 7B may include the subject matter of any of Examples 1B-6B, and may further specify that the first optical component is coupled to the surface of the core by optical glue or by fusion bonding.

Example 8B may include the subject matter of any of Examples 1B-7B, and may further specify that the interconnect die is an electrical integrated circuit (EIC).

Example 9B may include the subject matter of any of Examples 1B-7B, and may further include an electrical integrated circuit (EIC) between the interconnect die and the PIC, and electrically coupled to the interconnect die and the PIC.

Example 10B may include the subject matter of any of Examples 1B-9B, and may further specify that the surface of the core is a second surface, the core further includes a first surface opposite the second surface, the dielectric material is a second dielectric material including second conductive pathways, and the photonic assembly and may further include a first dielectric material on the first surface of the core, the first dielectric material including first conductive pathways; and a circuit board electrically coupled to the first conductive pathways.

Example 11B may include the subject matter of any of Examples 1B-10B, and may further specify that the PIC is one of a plurality of PICs, the first optical component is one of a plurality of first optical components, the second optical component is one of a plurality of second optical components, and the optical pathway is one of a plurality of optical pathways.

Example 12B may include the subject matter of any of Examples 1B-11B, and may further specify that the second optical component is coupled to the core by a plug or a socket.

Example 13B is a photonic assembly, including a substrate, including a core having a surface, wherein a material of the core includes glass and the core includes a first optical component; and a dielectric material on a portion of the surface of the core, the dielectric material including conductive pathways and an interconnect die; a photonic integrated circuit (PIC) having an active surface facing towards the surface of the core, wherein the PIC is electrically coupled to the interconnect die and to the conductive pathways in the dielectric material at the surface of the core; a processor integrated circuit (XPU) electrically coupled to the interconnect die and to the conductive pathways in the dielectric material at the surface of the core; a second optical component optically coupled to the active surface of the PIC and to the first optical component in the core; and a third optical component coupled to the first optical component in the core, wherein the third optical component is optically coupled to the PIC by an optical pathway through the first and second optical components.

Example 14B may include the subject matter of Example 13B, and may further specify that the first optical component includes a gradient-index (GRIN) lens.

Example 15B may include the subject matter of Examples 13B or 14B, and may further specify that the second optical component includes a waveguide.

Example 16B may include the subject matter of any of Examples 13B-15B, and may further specify that the second optical component includes a glass block, a glass block with a reflector, a glass block with a curved surface, a glass block with a mirror reflector, a glass block with a multi-directional reflector, a glass block with a waveguide, a glass block with a laser written waveguide, an optical lens, or a micro-lens.

Example 17B may include the subject matter of any of Examples 13B-16B, and may further specify that the third optical component is a fiber connector.

Example 18B may include the subject matter of any of Examples 13B-17B, and may further specify that the second optical component is coupled to the first optical component by optical glue or by fusion bonding.

Example 19B may include the subject matter of any of Examples 13B-18B, and may further specify that the interconnect die is an electrical integrated circuit (EIC).

Example 20B may include the subject matter of any of Examples 13B-18B, and may further include an electrical integrated circuit (EIC) between the interconnect die and the PIC, and electrically coupled to the interconnect die and the PIC.

Example 21B is a photonic assembly, including a substrate, including a core having a surface, wherein a material of the core includes glass; and a dielectric material on a portion of the surface of the core, the dielectric material including conductive pathways and an interconnect die; a photonic integrated circuit (PIC) having an active surface facing towards the surface of the core, wherein the PIC is electrically coupled to the interconnect die and to the conductive pathways in the dielectric material at the surface of the core; an integrated circuit (IC) electrically coupled to the interconnect die and to the conductive pathways in the dielectric material at the surface of the core; a first optical component optically coupled to the active surface of the PIC and to the surface of the core, wherein at least a portion of the first optical component is between the active surface of the PIC and the surface of the core; and a second optical component coupled to the core, wherein the second optical component is optically coupled to the PIC by an optical pathway through the first optical component and the core.

Example 22B may include the subject matter of Example 21B, and may further specify that the first optical component includes a glass block, a glass block with a reflector, a glass block with a curved surface, a glass block with a mirror reflector, a glass block with a multi-directional reflector, a glass block with a waveguide, a glass block with a laser written waveguide, an optical lens, a micro-lens, or a gradient-index (GRIN) lens.

Example 23B may include the subject matter of Examples 21B or 22B, and may further specify that the second optical component is a fiber connector.

Example 24B may include the subject matter of any of Examples 21B-23B, and may further specify that the optical pathway includes a waveguide.

Example 25B may include the subject matter of any of Examples 21B-24B, and may further specify that the interconnect die is an electrical integrated circuit (EIC) and the IC is a processor integrated circuit (XPU).

Example 26B may include the subject matter of any of Examples 21B-24B, and may further specify that the IC is a processor integrated circuit (XPU), and the photonic assembly may further include an electrical integrated circuit (EIC) between the interconnect die and the PIC, and electrically coupled to the interconnect die and the PIC.

Example 27B may include the subject matter of any of Examples 21B-26B, and may further specify that the surface of the core is a second surface, the core further includes a first surface opposite the second surface, the dielectric material is a second dielectric material including second conductive pathways, and the photonic assembly and may further include a first dielectric material on the first surface of the core, the first dielectric material including first conductive pathways; and a circuit board electrically coupled to the first conductive pathways.

Example 28B may include the subject matter of any of Examples 21B-27B, and may further specify that the second optical component is coupled to the core by a plug or a socket.

The invention claimed is:

1. A photonic assembly, comprising:
- a substrate, including:
  - a core having a surface, wherein a material of the core includes glass; and
  - a dielectric material on a portion of the surface of the core, the dielectric material including conductive pathways and an interconnect die;
- a photonic integrated circuit (PIC) having an active surface facing towards the surface of the core, wherein the PIC is electrically coupled to the interconnect die and to the conductive pathways in the dielectric material at the surface of the core;
- a processor integrated circuit (XPU) electrically coupled to the interconnect die and to the conductive pathways in the dielectric material at the surface of the core;
- a first optical component optically coupled to the active surface of the PIC and to the surface of the core; and
- a second optical component coupled to the core, wherein the second optical component is optically coupled to the PIC by an optical pathway through the first optical component and the core.

2. The photonic assembly of claim 1, wherein the first optical component includes a glass block, a glass block with a reflector, a glass block with a curved surface, a glass block with a mirror reflector, a glass block with a multi-directional reflector, a glass block with a waveguide, a glass block with a laser written waveguide, an optical lens, a micro-lens, or a gradient-index (GRIN) lens.

3. The photonic assembly of claim 1, wherein the second optical component is a fiber connector.

4. The photonic assembly of claim 1, wherein the first optical component is coupled to the active surface of the PIC by an optical glue or by fusion bonding.

5. The photonic assembly of claim 1, wherein the optical pathway includes a waveguide.

6. The photonic assembly of claim 1, wherein the interconnect die is an electrical integrated circuit (EIC).

7. The photonic assembly of claim 1, further comprising:
- an electrical integrated circuit (EIC) between the interconnect die and the PIC, and electrically coupled to the interconnect die and the PIC.

8. The photonic assembly of claim 1, wherein the surface of the core is a second surface, the core further includes a first surface opposite the second surface, the dielectric material is a second dielectric material including second conductive pathways, and the photonic assembly further comprising:

a first dielectric material on the first surface of the core, the first dielectric material including first conductive pathways; and a circuit board electrically coupled to the first conductive pathways.

9. The photonic assembly of claim 1, wherein the second optical component is coupled to the core by a plug or a socket.

10. A photonic assembly, comprising:

a substrate, including:

a core having a surface, wherein a material of the core includes glass; and a dielectric material on a portion of the surface of the core, the dielectric material including conductive pathways and an interconnect die;

a photonic integrated circuit (PIC) having an active surface facing towards the surface of the core, wherein the PIC is electrically coupled to the interconnect die and to the conductive pathways in the dielectric material at the surface of the core;

a processor integrated circuit (XPU) electrically coupled to the interconnect die and to the conductive pathways in the dielectric material at the surface of the core;

a first optical component optically coupled to the active surface of the PIC and to the surface of the core; and a second optical component coupled to the core, wherein the second optical component is optically coupled to the PIC by an optical pathway through the first optical component and the core, wherein:

the PIC is one of a plurality of PICS, the first optical component is one of a plurality of first optical components, the second optical component is one of a plurality of second optical components, and the optical pathway is one of a plurality of optical pathways.

11. The photonic assembly of claim 10, wherein the first optical component includes a glass block, a glass block with a reflector, a glass block with a curved surface, a glass block with a mirror reflector, a glass block with a multi-directional reflector, a glass block with a waveguide, a glass block with a laser written waveguide, an optical lens, a micro-lens, or a gradient-index (GRIN) lens.

12. The photonic assembly of claim 10, wherein the optical pathway includes a waveguide.

13. The photonic assembly of claim 12, wherein the waveguide is a laser written waveguide.

14. The photonic assembly of claim 10, wherein the second optical component is a fiber connector.

15. The photonic assembly of claim 10, wherein the interconnect die is an electrical integrated circuit (EIC).

16. A photonic assembly, comprising:

a substrate, including:

a core having a surface, wherein a material of the core includes glass; and a dielectric material on a portion of the surface of the core, the dielectric material including conductive pathways and an interconnect die;

a photonic integrated circuit (PIC) having an active surface facing towards the surface of the core, wherein the PIC is electrically coupled to the interconnect die and to the conductive pathways in the dielectric material at the surface of the core;

a processor integrated circuit (XPU) electrically coupled to the interconnect die and to the conductive pathways in the dielectric material at the surface of the core;

a first optical component optically coupled to the active surface of the PIC and to the surface of the core, wherein at least a portion of the first optical component is between the active surface of the PIC and the surface of the core; and a second optical component coupled to the core, wherein the second optical component is optically coupled to the PIC by an optical pathway through the first optical component and the core.

17. The photonic assembly of claim 16, wherein the first optical component includes a glass block, a glass block with a reflector, a glass block with a curved surface, a glass block with a mirror reflector, a glass block with a multi-directional reflector, a glass block with a waveguide, a glass block with a laser written waveguide, an optical lens, a micro-lens, or a gradient-index (GRIN) lens.

18. The photonic assembly of claim 16, wherein the optical pathway includes a waveguide.

19. The photonic assembly of claim 18, wherein the waveguide is a laser written waveguide.

20. The photonic assembly of claim 16, wherein the second optical component is a fiber connector.

* * * * *